(12) United States Patent
Han et al.

(10) Patent No.: US 12,120,929 B2
(45) Date of Patent: Oct. 15, 2024

(54) DISPLAY APPARATUS AND METHOD OF MANUFACTURING THE SAME

(71) Applicant: Samsung Display Co., Ltd., Yongin-Si (KR)

(72) Inventors: Yunseok Han, Yongin-si (KR); Dowon Yi, Yongin-si (KR); Myounghee Lee, Yongin-si (KR); Jungmi Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 17/460,393

(22) Filed: Aug. 30, 2021

(65) Prior Publication Data
US 2022/0165831 A1 May 26, 2022

(30) Foreign Application Priority Data
Nov. 24, 2020 (KR) .................. 10-2020-0159092

(51) Int. Cl.
*H10K 59/126* (2023.01)
*H10K 50/856* (2023.01)
(Continued)

(52) U.S. Cl.
CPC ....... *H10K 59/126* (2023.02); *H10K 59/1201* (2023.02); *H10K 59/40* (2023.02)

(58) Field of Classification Search
CPC .. H10K 59/121; H10K 59/122; H10K 59/124; H10K 59/126; H10K 50/813
See application file for complete search history.

(56) References Cited

U.S. PATENT DOCUMENTS 6,703,146 B1  3/2004  Sakaguchi et al.
10,418,585 B2  9/2019  Han et al.
(Continued)

FOREIGN PATENT DOCUMENTS

JP        6035450 B2    11/2016
JP     2019-084753 A     6/2019
(Continued)

OTHER PUBLICATIONS

A. El Hamidi, K. Meziane, A. El Hichou, T. Jannane, A. Liba, J. El Haskouri, P. Amoros, and A. Almaggoussi, "Refractive index controlled by film morphology and free carrier density in undoped ZnO through sol-pH variation", Journal, Optik 158 (2018) 1139-1146, 8 pages, Accepted Jan. 6, 2018, Amsterdam, Netherlands.

*Primary Examiner* — Mohsen Ahmadi
(74) *Attorney, Agent, or Firm* — Innovation Counsel LLP

(57) ABSTRACT

Provided are a display apparatus, of which a display area is expanded for the representation of images in an area where an electronic component is located and in which the degradation in performance of the electronic component is reduced, and a method of manufacturing the display apparatus. The display apparatus includes a substrate, a light-emitting element disposed on the substrate, and a lower metal layer disposed under the light-emitting element. The lower metal layer includes a first surface facing the substrate and including an uneven portion, and a second surface opposite to the first surface. The first surface of the lower metal layer has surface roughness greater than that of the second surface of the lower metal layer.

16 Claims, 30 Drawing Sheets

(51) Int. Cl.
*H10K 59/00* (2023.01)
*H10K 59/12* (2023.01)
*H10K 59/121* (2023.01)
*H10K 59/35* (2023.01)
*H10K 59/40* (2023.01)
*H10K 59/60* (2023.01)
*H10K 59/65* (2023.01)
*H10K 71/00* (2023.01)

(56) References Cited

U.S. PATENT DOCUMENTS

| | | | |
|---|---|---|---|
| 2015/0102292 A1* | 4/2015 | Kim | H10K 50/8426 |
| | | | 257/40 |
| 2015/0200237 A1* | 7/2015 | Yim | H10K 59/131 |
| | | | 257/40 |
| 2016/0370580 A1 | 12/2016 | Takada et al. | |
| 2017/0170252 A1* | 6/2017 | Kim | H01L 28/60 |
| 2017/0222168 A1* | 8/2017 | Ikeda | H10K 10/466 |
| 2017/0278898 A1* | 9/2017 | Kim | H10K 59/40 |
| 2020/0227494 A1 | 7/2020 | Bae et al. | |
| 2020/0373513 A1* | 11/2020 | Kim | H05K 7/20963 |
| 2021/0183296 A1* | 6/2021 | Lee | G09G 3/32 |
| 2021/0202900 A1* | 7/2021 | Lee | H10K 59/121 |
| 2021/0249635 A1* | 8/2021 | Cho | H10K 59/121 |
| 2021/0303091 A1* | 9/2021 | Son | G02F 1/133509 |
| 2021/0305521 A1* | 9/2021 | Han | H10K 77/111 |
| 2021/0359074 A1* | 11/2021 | You | H10K 59/1213 |
| 2021/0376007 A1* | 12/2021 | Choi | H10K 71/233 |
| 2021/0376033 A1* | 12/2021 | Chae | H10K 59/126 |
| 2021/0376292 A1* | 12/2021 | Choi | H10K 50/844 |
| 2021/0391400 A1* | 12/2021 | Kim | H10K 59/126 |
| 2021/0391407 A1* | 12/2021 | Yoon | G06F 3/0412 |
| 2021/0399060 A1* | 12/2021 | Seo | H10K 59/121 |
| 2022/0045160 A1* | 2/2022 | Lee | H10K 59/121 |
| 2022/0069045 A1* | 3/2022 | Ebisuno | H10K 59/1213 |
| 2022/0216287 A1* | 7/2022 | You | H10K 71/421 |

FOREIGN PATENT DOCUMENTS

| | | |
|---|---|---|
| KR | 10-0389568 B1 | 6/2003 |
| KR | 10-2016-0062824 A | 6/2016 |
| KR | 10-2017-0128752 A | 11/2017 |
| KR | 10-2020-0089380 A | 7/2020 |

* cited by examiner

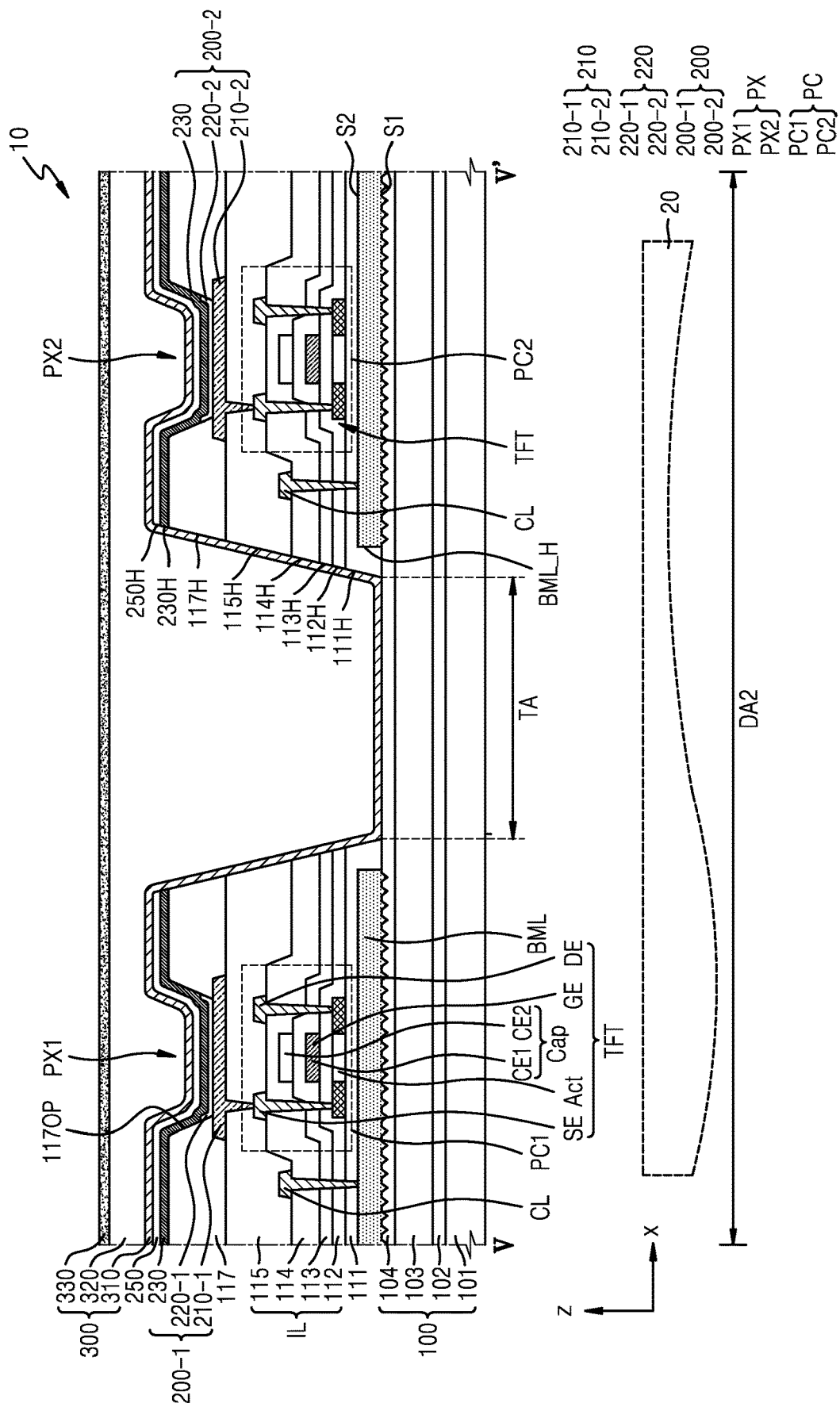

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2020-0159092, filed on Nov. 24, 2020, in the Korean Intellectual Property Office, the disclosure of which is incorporated by reference herein in its entirety.

BACKGROUND

1. Field

One or more embodiments relate to a display apparatus and a method of manufacturing the same, and more particularly, to a display apparatus, of which a display area is expanded to enable the representation of images in an area where an electronic component is located, and a method of manufacturing the display apparatus.

2. Description of the Related Art

Recently, display apparatuses have been used in various fields. Also, as the thickness and weight of display apparatuses have been reduced, the range of use of the display apparatuses has widened.

An increase in the display area in a display apparatus becomes very important as various functions are added to the display apparatus. To add various functions while increasing the areas of the display areas, research has been conducted into display apparatuses in which various components can be arranged in their display areas.

SUMMARY

One or more embodiments provide a display apparatus, of which a display area is expanded for the representation of images in an area where an electronic component is located and in which the degradation in performance of the electronic component is reduced, and a method of manufacturing the display apparatus. However, this is merely an example, and one or more embodiments of the disclosure are not limited thereto.

Additional aspects will be set forth in part in the description which follows and, in part, will be apparent from the description, or may be learned by practice of the presented embodiments of the disclosure.

According to one or more embodiments, provided is a display apparatus including first display area and a second display area including a transmission area, the display apparatus including a substrate, a first light-emitting element and a second light-emitting element that are arranged in the second display area and apart from each other on the substrate with the transmission area between the first light-emitting element and the second light-emitting element, and a lower metal layer arranged under the first and second light-emitting elements, wherein the lower metal layer includes a first surface facing the substrate and a second surface opposite to the first surface, and the first surface of the lower metal layer includes an uneven portion.

A surface roughness of the first surface of the lower metal layer may be greater than a surface roughness of the second surface of the lower metal layer.

The display apparatus may include a pattern layer arranged between the substrate and the lower metal layer.

The pattern layer may include a material different from the lower metal layer.

The pattern layer may include an inorganic insulating material.

The pattern layer may include amorphous silicon.

A thickness of the pattern layer may be less than a thickness of the lower metal layer.

A thickness of the pattern layer may be between about 50 Å and about 400 Å.

The lower metal layer and the pattern layer may each include an opening corresponding to the transmission area.

A portion of the first surface of the lower metal layer may contact the substrate, and another portion of the first surface of the lower metal layer may contact the pattern layer.

The pattern layer may include a body portion and a plurality of pattern openings which are spaced apart from each other and at least some of which are surrounded by the body portion.

The first surface of the lower metal layer may include a plurality of convex portions and a plurality of concave portions, and the plurality of convex portions may be arranged in the plurality of pattern openings of the pattern layer.

Each of the plurality of pattern openings of the pattern layer may have a circular shape, an oval shape, or a polygonal shape in a plan view.

The pattern layer may include a plurality of pattern material portions that are spaced apart from each other in a plan view, and each of the plurality of pattern material portions may be in an island form.

The first surface of the lower metal layer may include a plurality of convex portions and a plurality of concave portions, and the plurality of convex portions may be respectively arranged between the plurality of pattern material portions of the pattern layer.

Each of the plurality of pattern material portions of the pattern layer may have a circular shape, an oval shape, or a polygonal shape on a plane.

The display apparatus may further include a pixel circuit arranged between the light-emitting element and the lower metal layer to overlap the lower metal layer in a plan view.

According to one or more embodiments, provided is a method of manufacturing a display apparatus, the method including preparing a substrate, forming a lower metal layer on the substrate, the lower metal layer including a first surface facing the substrate and a second surface opposing the first surface, and forming a light-emitting element disposed on the lower metal layer. The first surface of the lower metal layer comprises uneven portions. The surface roughness of the first surface may be greater than that of the second surface.

The method may further include forming a first material layer that includes a material different from the lower metal layer on the substrate and patterning the first material layer to form pattern layer. The forming the lower metal layer may include forming a second material layer on the pattern layer and patterning the second material layer The first material layer may include an inorganic insulating material or amorphous silicon.

The method of forming of the lower metal layer may include forming the second material layer on the substrate, irradiating laser to the surface of the second material layer through the substrate and patterning the second material layer.

According to the present embodiment, the forming of the lower metal layer may include forming an uneven portion on a surface of the substrate through plasma treatment, forming a second material layer on the surface of the substrate, and patterning the second material layer.

The method may further include forming a protection layer including an inorganic insulating material on the substrate and forming an uneven portion on a surface of the protection layer through plasma treatment, wherein the forming of the lower metal layer may include forming a second material layer on the surface of the protection layer and patterning the second material layer.

The method may further include forming a pixel circuit disposed between the lower metal layer and the light-emitting element, overlapping the lower metal layer in a plan view, and electrically connected to the light-emitting element.

Other aspects, features, and advantages other than those described above will become apparent from the following detailed description, claims and drawings for carrying out the invention.

The general and specific aspects may be implemented by using a system, a method, a computer program, or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 13A, 13B, 13C, 13D and 13E are schematic cross-sectional views illustrating some of manufacturing processes of an electronic apparatus, according to another embodiment.

DETAILED DESCRIPTION

Figure 1:
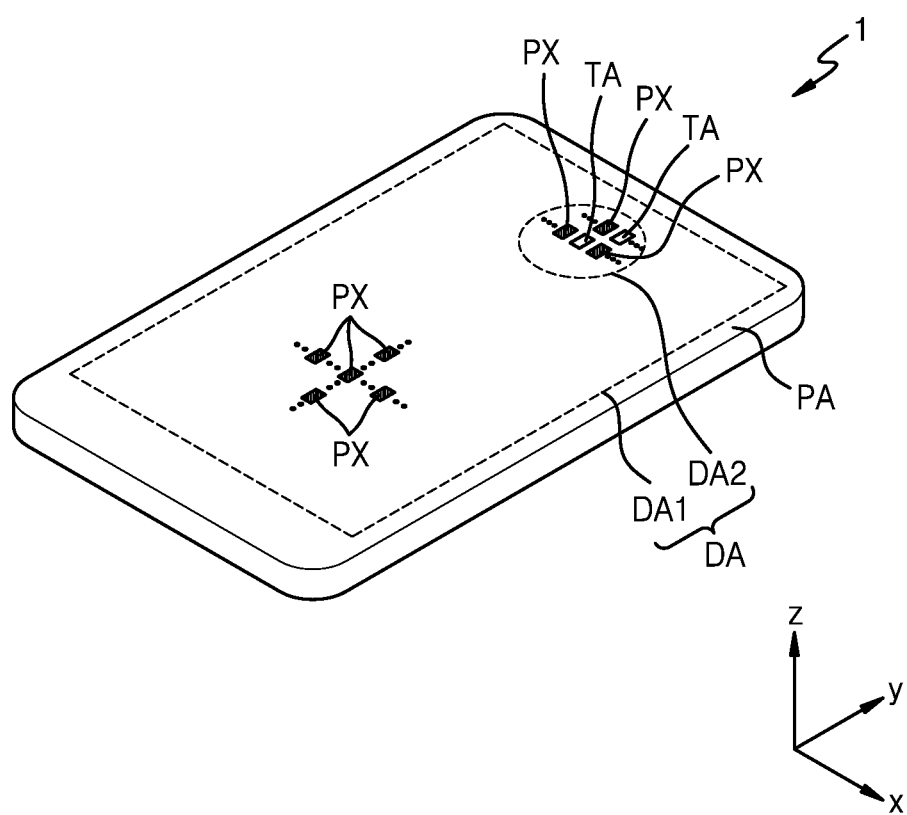
FIG. 1 is a schematic perspective view of an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating preferred embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will be omitted.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms comprises and/or comprising used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

In the present embodiment, an expression such as "A and/or B" indicates A, B, or A and B. Also, an expression such as "at least one of A and B" indicates A, B, or A and B.

It will be understood that when a component, such as a layer, a film, a region, or a plate, is referred to as being "connected to" another component, the component can be directly connected to the other component or intervening components may be present therebetween. It will be understood that when a component, such as a layer, a film, a region, or a plate, is referred to as being "electrically connected to" another component, the component can be directly electrically connected to the other component or intervening components may be present therebetween for indirect electrical connection.

The x-axis, the y-axis and the z-axis are not limited to three axes of the rectangular coordinate system and may be interpreted in a broader sense. For example, the x-axis, the y-axis, and the z-axis may be perpendicular to one another, or may represent different directions that are not perpendicular to one another.

FIG. 1 is a schematic perspective view of an electronic apparatus according to an embodiment.

Referring to FIG. 1, an electronic apparatus 1 may include a display area DA and a peripheral area PA adjacent to the display area DA. The electronic apparatus 1 may provide images by using an array of pixels PX arranged in the display area DA.

The pixels PX may be arranged in a first display area DA1 and a second display area DA2, and arrays of the pixels PX in the first display area DA1 and the second display area DA2 may differ from each other. For example, transmission areas TA may be disposed between adjacent pixels PX in the second display area DA2 but the transmission areas TA may not be disposed in the first display area DA1.

The electronic apparatus 1 may display a first image by using light emitted from the pixels PX arranged in the first display area DA1 and provide a second image by using light emitted from the pixels PX arranged in the second display area DA2. In some embodiments, the first image and the second image may be portions of any one of images provided from the display area DA of the electronic apparatus 1. Alternatively, in some embodiments, the electronic apparatus 1 may provide the first image and the second image that are independent from each other.

The second display area DA2 may include the transmission area TA disposed between the adjacent pixels PX. The transmission area TA may be an area where light may pass through and no pixels are arranged.

The peripheral area PA may be a non-display area where no images is displayed and may entirely or partially surround the display area DA. In the peripheral area PA, a driver for providing an electrical signal or power to the display area DA, and the like, may be arranged. A pad may be arranged in the peripheral area PA, the pad being an area where an electrical device, a printed circuit board, or the like, is electrically connected to each other.

The second display area DA2 may have a circular shape or an oval shape in a plan view, as illustrated in FIG. 1. However, one or more embodiments are not limited thereto. For example, the second display area DA2 may have a polygonal shape such as a square shape or a bar shape.

The second display area DA2 may be arranged inside the first display area DA1 or on a side thereof. As illustrated in FIG. 1, the second display area DA2 may be entirely surrounded by the first display area DA1. In some embodiments, the second display area DA2 may be partially surrounded by the first display area DA1. For example, the second display area DA2 may be partially surrounded by the first display area DA1 while the second display area DA2 is arranged on a corner of the first display area DAL.

A ratio of the second display area DA2 to the display area DA may be less than a ratio of the first display area DA1 to the display area DA. As illustrated in FIG. 1, the electronic apparatus 1 may include one second display area DA2. However, the electronic apparatus 1 may include two or more second display areas DA2.

As illustrated in FIG. 1, the shape of the electronic apparatus 1 may be a rectangle having round corners in a plan view. However, one or more embodiments are not limited thereto. The shape of the electronic apparatus 1 may vary, for example, the electronic apparatus 1 may have a polygon shape, a circular shape, an oval shape, and the like.

The electronic apparatus 1 may be a mobile phone, a tablet personal computer (PC), a laptop computer, a wrist-worn smart watch or smart band, an electronic apparatus for a vehicle, and the like.

The electronic apparatus 1 may be a portable apparatus, for example, a mobile phone, a smartphone, a tablet PC, a mobile communication terminal, a personal digital assistant (PDA), an electronic book, a portable multimedia player (PMP), a navigation device, an Ultra Mobile PC (UMPC), or the like. Also, the electronic apparatus 1 according to an embodiment may be a wearable device such as a smart watch, a watch phone, an eyewear display or a head mounted display (HMD).

Hereinafter, it is described that the electronic apparatus 1 includes an organic light-emitting diode (OLED) as a light-emitting element, but one or more embodiments are not limited thereto. In another embodiment, the electronic apparatus 1 may include a light-emitting display apparatus including inorganic light-emitting diodes, that is, an inorganic light emitting display apparatus. The inorganic light-emitting diodes may include PN diodes including inorganic semiconductors. When a voltage is applied to PN junction diodes in a forward direction, electrons and holes may be injected, and energy generated by recombination of the electrons and holes is converted into light, thus emitting light of a certain color. The above-described inorganic light-emitting diodes may have widths of several to several hundreds of micrometers, and in some embodiments, the inorganic light-emitting diodes may be referred to as micro LEDs. In another embodiment, the electronic apparatus 1 may include a quantum dot light-emitting display.

Figure 2A:
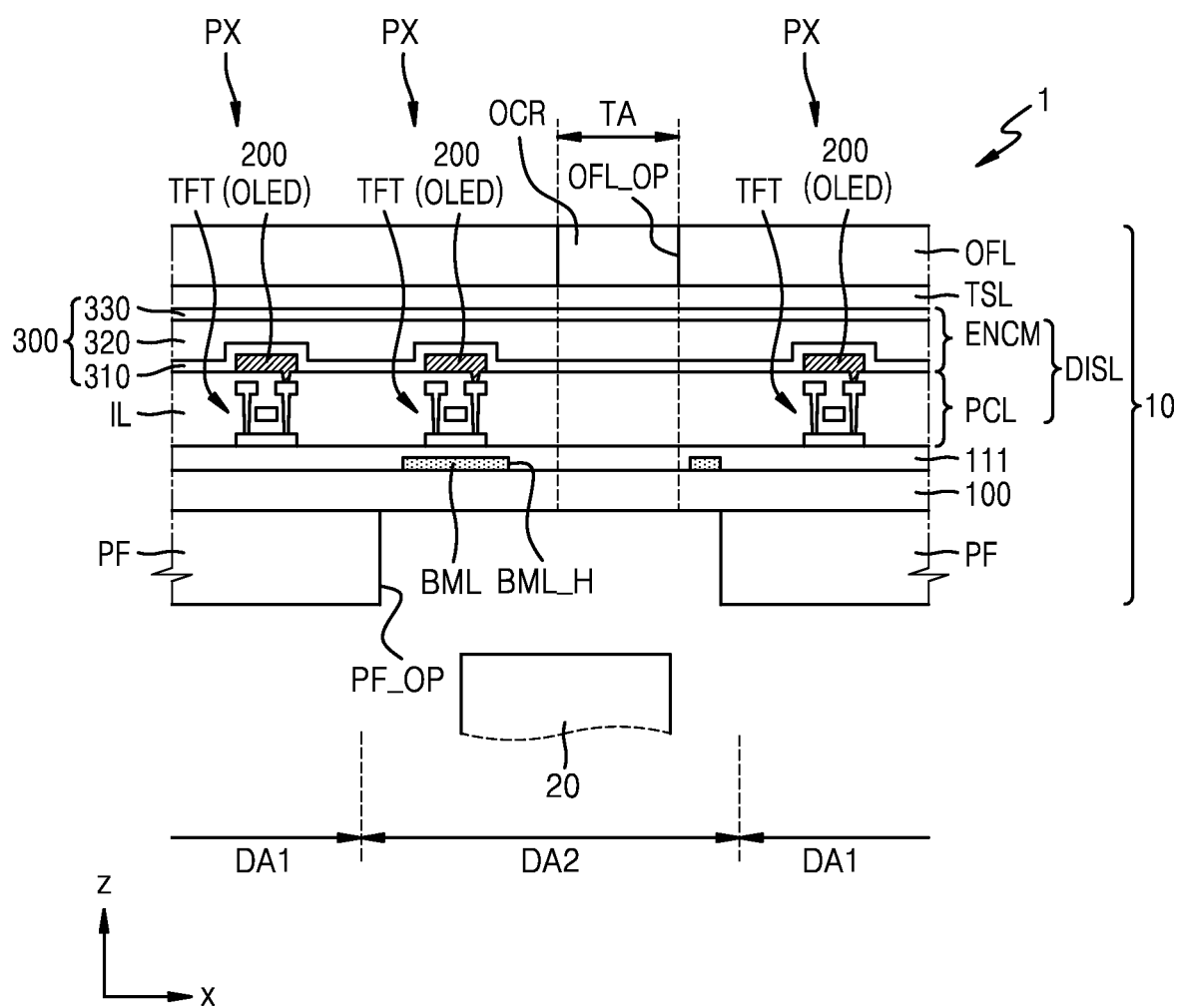
FIGS. 2A and 2B are respectively schematic cross-sectional views illustrating part of an electronic apparatus, according to embodiments.
Figure 2B:
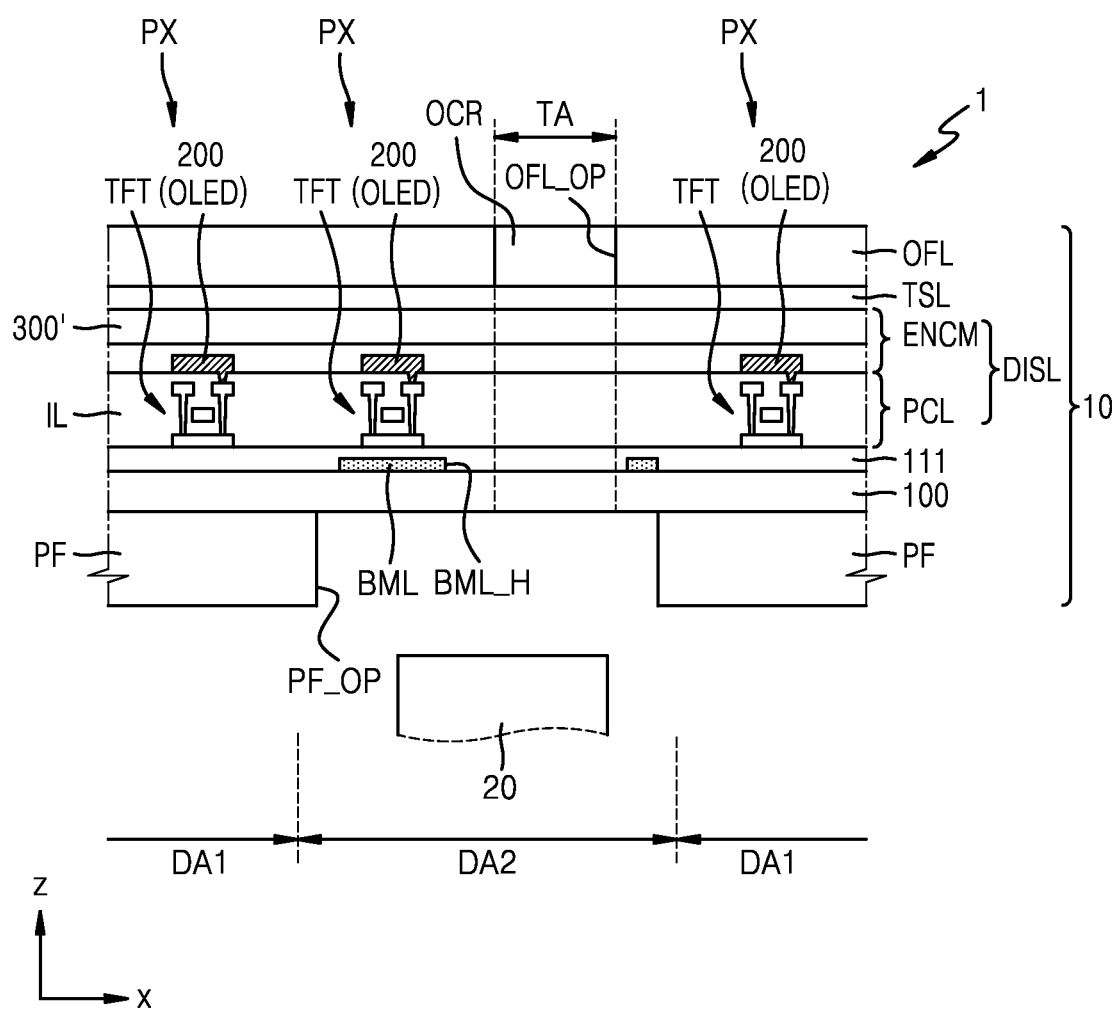

FIGS. 2A and 2B are schematic cross-sectional views respectively illustrating part of an electronic apparatus, according to embodiments.

Referring to FIGS. 2A and 2B, the electronic apparatus 1 may include a display apparatus 10 and an electronic component 20 overlapping the display apparatus 10 in a plan view.

The display apparatus 10 may include the first display area DA1, where the first image is displayed, and the second display area DA2, where the second image is displayed and which overlaps the electronic component 20 in a plan view.

The display apparatus 10 may include a display layer DISL on a substrate 100, a touch screen layer TSL, an optical functional layer OFL, and a lower protection film PF under the substrate 100. The display layer DISL may include a circuit layer PCL including a thin film transistor TFT, an organic light-emitting diode OLED as a light-emitting element, and a sealing layer ENCM covering the organic light-emitting diode OLED. A buffer layer 111 may be arranged between the substrate 100 and the display layer DISL. An insulating layer IL may be arranged in the display layer DISL in the circuit layer PCL.

The substrate 100 may include glass or polymer resin. For example, the substrate 100 may include polymer resin such as polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 including the polymer resin may be flexible, for example, bendable, foldable, or rollable. The substrate 100 may have a multilayered structure including the aforementioned polymer resin and an inorganic layer (not shown).

The display layer DISL may include the thin film transistor TFT electrically connected to the organic light-emitting diode OLED and the insulating layer IL. The organic light-emitting diode OLED may emit light of different colors, for example, red light, green light, or blue light, according to types of organic materials included in the organic light-emitting diode OLED.

In each of the first display area DA1 and the second display area DA2, a light-emitting element 200, that is, the organic light-emitting diode OLED, may be arranged. The organic light-emitting diode OLED in the display layer DISL may emit light through an emission area, and the emission area may be defined as the pixel PX. Therefore, the pixel PX may be defined as an area where light, for example, red light, green light, or blue light, may be emitted. The pixels PX may be arranged in the first display area DA1 and the second display area DA2, respectively.

In the first display area DA1, the thin film transistor TFT electrically connected to the light-emitting element 200 in the first display area DA1 may be arranged. For example, in the second display area DA2, the thin film transistor TFT electrically connected to the light-emitting element 200 in the second display area DA2 may be arranged. As another example, the thin film transistor TFT electrically connected to the light-emitting element 200 in the second display area DA2 may not be disposed in the second display area DA2 but are disposed in the peripheral area PA.

The second display area DA2 may include the transmission area TA where the thin film transistor TFT and the organic light-emitting diode OLED are not arranged. The transmission area TA may be an area where light/signals from or incident to the electronic component 20 may be transmitted. In the display apparatus 10, the transmittance of the transmission area TA may be equal to or greater than about 30%, 40%, 50%, 60%, 75%, 80%, 85%, or 90%.

A lower metal layer BML may be arranged in the second display area DA2. The lower metal layer BML may be disposed under the light-emitting element 200 arranged in the second display area DA2. When the thin film transistor TFT is arranged in the second display area DA2, the lower metal layer BML may be disposed under the thin film transistor TFT. For example, the lower metal layer BML may be disposed between the substrate 100 and the thin film transistor TFT.

The lower metal layer BML may include an opening BML_H through which light emitted from or towards the electronic component 20 may pass. The opening BML_H of the lower metal layer BML may be formed to correspond to the transmission area TA. To this end, the degradation in the light transmittance in the transmission area TA due to the lower metal layer BML may be prevented.

The lower metal layer BML may prevent the light, which is emitted from the electronic component 20 or reflected therefrom, from being incident to the thin film transistor TFT disposed in the second display area DA2. Thus, the performance degradation of the thin film transistor TFT may be prevented or reduced.

In some embodiments, a constant voltage or signals may be transmitted to the lower metal layer BML. Damage to the pixel circuit by an electrostatic discharge may be prevented by the lower metal layer BML which has the constant voltage. The lower metal layer BML may be provided in plural in the second display area DA2, and in some cases, different voltages may be applied to the lower metal layers BML, respectively.

The organic light-emitting diode OLED may be covered by the thin film encapsulation layer 300 or the sealing layer ENCM which includes a sealing substrate 300'. As illustrated in FIG. 2A, the organic light-emitting diode OLED may be covered by the thin film encapsulation layer 300. In an embodiment, the thin film encapsulation layer 300 may include one inorganic encapsulation layer and at least one organic encapsulation layer. For example, the thin film encapsulation layer 300 may include a first inorganic encapsulation layer 310 and a second inorganic encapsulation layer 330, and an organic encapsulation layer 320 disposed therebetween.

As illustrated in FIG. 2B, the sealing substrate 300' may face the substrate 100 with the organic light-emitting diode OLED interposed between the sealing substrate 300' and the substrate 100. There may be a gap between the sealing substrate 300' and the organic light-emitting diode OLED. The sealing substrate 300' may include a rigid substrate including a material such as encapsulation glass. A sealant such as frit may be disposed between the substrate 100 and the sealing substrate 300', and the sealant may be in the above-described peripheral area PA (see FIG. 1). The sealant in the peripheral area PA may surround the display area DA (see FIG. 1) and may prevent moisture from penetrating through a side surface of the display layer DISL.

The touch screen layer TSL may obtain coordinate information according to an external input, for example, a touch event. The touch screen layer TSL may include a touch electrode and touch lines connected to the touch electrode. The touch screen layer TSL may detect an external input in a self-capacitance or mutual capacitance manner.

The touch screen layer TSL may be formed or disposed on the sealing layer ENCM. Alternatively, after separately formed, the touch screen layer TSL may be coupled to the sealing layer ENCM by an adhesive layer such as an optical clear adhesive (OCA). In an embodiment, as illustrated in FIGS. 2A and 2B, the touch screen layer TSL may be directly formed on the sealing layer ENCM, and in this case, the adhesive layer may not be disposed between the touch screen layer TSL and the sealing layer ENCM.

The optical functional layer OFL may include a reflection prevention layer and may be disposed on the touch screen layer TSL. The reflection prevention layer may decrease a reflection of external light that is incident to the display apparatus 10.

In some embodiments, the optical functional layer OFL may be a polarization film. The optical functional layer OFL may include an opening OFL_OP corresponding to the transmission area TA. Accordingly, the light transmittance of the transmission area TA may be greatly improved. The opening OFL_OP may be filled with a clear material such as optically clear resin (OCR).

The lower protection film PF may be attached to a lower surface of the substrate 100. The adhesive layer (not shown) may be arranged between the lower protection film PF and the substrate 100. Alternatively, the lower protection film PF may be directly formed on the lower surface of the substrate 100, and in this case, the adhesive layer may not be arranged between the lower protection film PF and the substrate 100.

The lower protection film PF may support and protect the substrate 100. As an example, the lower protection film PF may include an opening PF_OP in an area corresponding to the second display area DA2. The opening PF_OP of the lower protection film PF may be a portion in which the lower protection film PF is removed. In some embodiments, the opening PF_OP of the lower protection film PF may be formed by completely removing the lower protection film PF in the thickness direction thereof, and in this case, as illustrated in FIGS. 2A and 2B, the opening PF_OP may be formed as a through hole. In some embodiments, the opening PF_OP of the lower protection film PF may be formed by partially removing the lower protection film PF in the thickness direction thereof.

As the lower protection film PF includes the opening PF_OP, the transmittance of the second display area DA2, for example, the light transmittance of the transmission area TA, may be improved. The lower protection film PF may include an organic insulating material such as PET or PI.

The electronic component 20 may be disposed to overlap the second display area DA2 in a plan view. The electronic component 20 may use light or sound. For example, the electronic component 20 may be a sensor, e.g., a proximity sensor, which measures a distance, a sensor for recognizing a body part of a user (e.g., fingerprints, an iris, faces, etc.), a small lamp for outputting light, an image sensor (e.g., a camera) for capturing images, or the like. The electronic component 20 using light may use light in various wavelength bands, for example, visible rays, infrared rays, ultraviolet rays, or the like. The electronic component 20 using sound may use ultrasound or light in a different frequency band. In some embodiments, the electronic component 20 may include sub-components such as a light emitter and a light receiver. The light emitter and the light receiver may be integrally formed or physically separated from each other, and a pair of the light emitter and the light receiver may form one electronic component 20.

One electronic component 20 or electronic components 20 may be arranged in the second display area DA2. When the electronic apparatus 1 includes electronic components 20, the number of electronic components 20 may correspond to the number of second display areas DA2 in the electronic apparatus 1. For example, the electronic apparatus 1 may include second display areas DA2 that are separated from each other. In some embodiments, the electronic components 20 may be arranged in one second display area DA2. For example, the electronic apparatus 1 may include the second display area DA2 of a bar type, and the electronic components 20 may be spaced apart from each other along a length direction of the second display area DA2.

Figure 3:
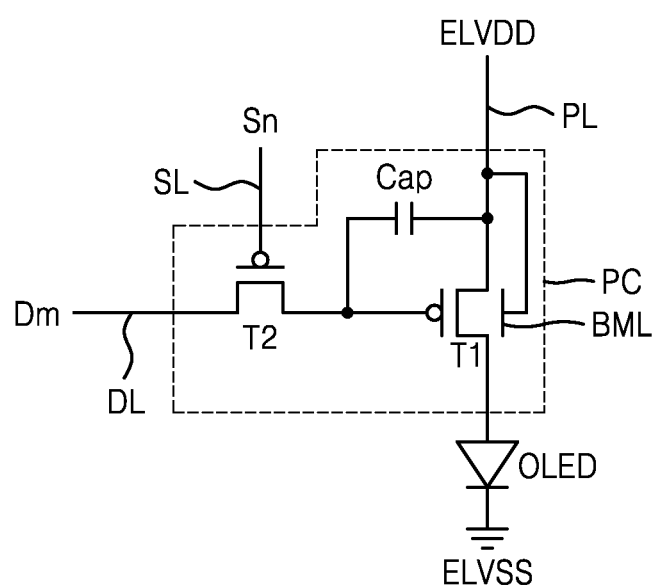
FIG. 3 is an equivalent circuit diagram of a pixel circuit of any one of pixels included in an electronic apparatus, according to an embodiment.

FIG. 3 is an equivalent circuit diagram of a pixel circuit of any one of pixels included in an electronic apparatus, according to an embodiment.

Referring to FIG. 3, the display apparatus 10 may include a pixel circuit PC and an organic light-emitting diode OLED that receives a driving voltage from the pixel circuit PC and emits light.

The pixel circuit PC may include the thin film transistors TFT (see FIGS. 2A and 2B) and a storage capacitor. According to an embodiment, as illustrated in FIG. 3, the pixel circuit PC may include a first thin film transistor T1, a second thin film transistor T2, and a storage capacitor Cap. For example, the first thin film transistor T1 may be a driving thin film transistor, and the second thin film transistor T2 may be a switching thin film transistor. A gate electrode of the second thin film transistor T2 may be connected to a scan line SL and a source electrode of the second thin film transistor T2 may be connected to a data line DL. The second thin film transistor T2 may transmit a data signal Dm, which is input through the data line DL, to a first node connected to a gate electrode of the first thin film transistor T1 in response to a scan signal Sn input through the scan line SL.

The storage capacitor Cap may be connected between a drain electrode of the second thin film transistor T2 and a driving power line PL. The storage capacitor Cap may store a voltage corresponding to a difference between a driving voltage ELVDD applied to the driving power line PL and a data voltage supplied from the data line DL through the second thin film transistor T2.

A source electrode of the first thin film transistor T1 may be connected to the driving power line PL and an electrode of the storage capacitor Cap, a drain electrode of the first thin film transistor T1 is connected to an anode of the organic light-emitting diode OLED, and a gate electrode of the first thin film transistor T1 is connected to the first node. The first thin film transistor T1 may control a driving current flowing through the organic light-emitting diode OLED from the driving power line PL, the driving current corresponding to the voltage stored in the storage capacitor Cap. A cathode of the organic light-emitting diode OLED may be connected to a common voltage ELVSS. The organic light-emitting diode OLED may emit light having certain brightness according to the driving current, thereby displaying images. Meanwhile, the positions of source electrodes and drain electrodes of FIG. 3 may be interchanged depending on the types (p-type or n-type) of transistors.

FIG. 3 illustrates that the pixel circuit PC includes two thin film transistors and one storage capacitor, but one or more embodiments are not limited thereto. For example, the pixel circuit PC may include three or more thin film transistors and/or two or more storage capacitors. In an embodiment, the pixel circuit PC may include seven thin film transistors and one storage capacitor. The numbers of thin film transistors and storage capacitors may vary according to a design of the pixel circuit PC. However, for convenience of explanation, the pixel circuit PC including two thin film transistors and one storage capacitor is described as an example.

Figure 4A:
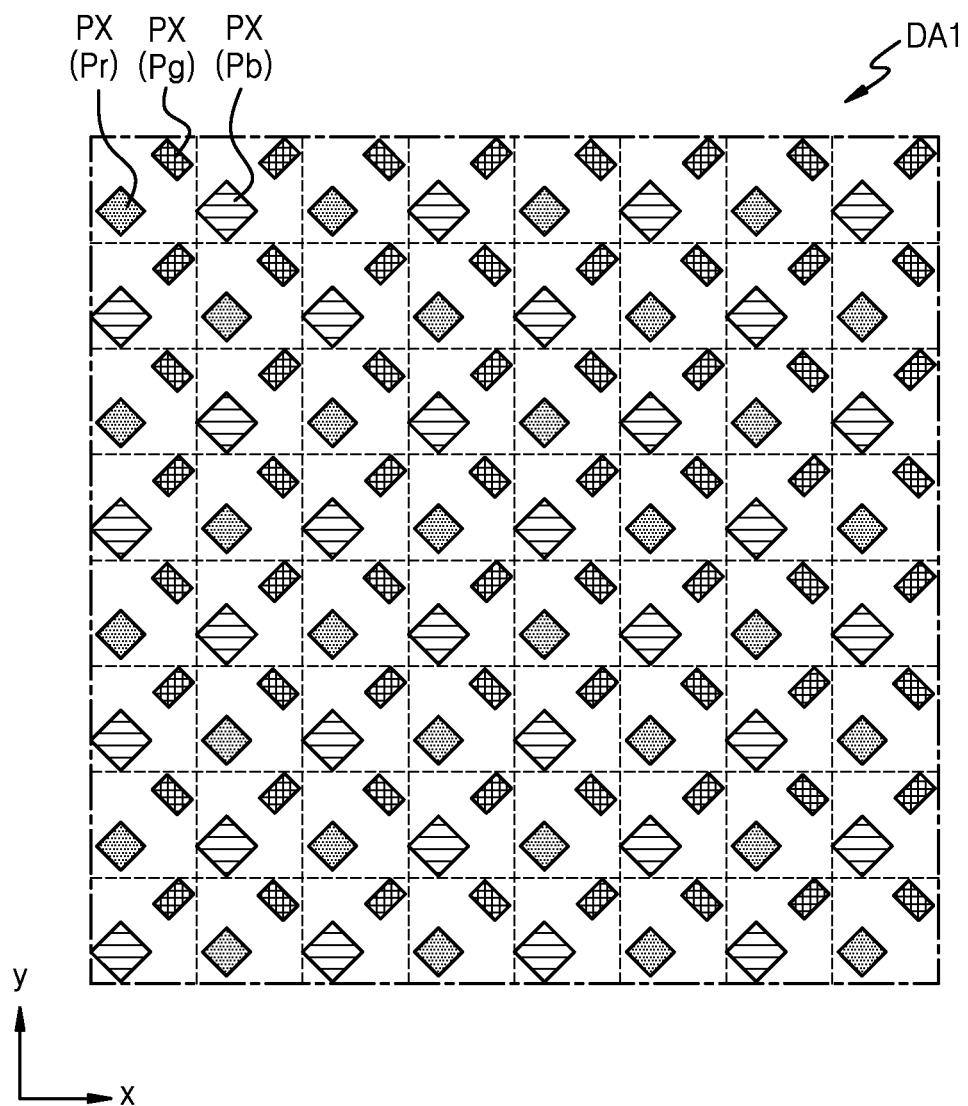
FIGS. 4A and 4B are schematic plan views respectively illustrating arrangements of pixels in a first display area and a second display area of an electronic apparatus, according to an embodiment.
Figure 4B:
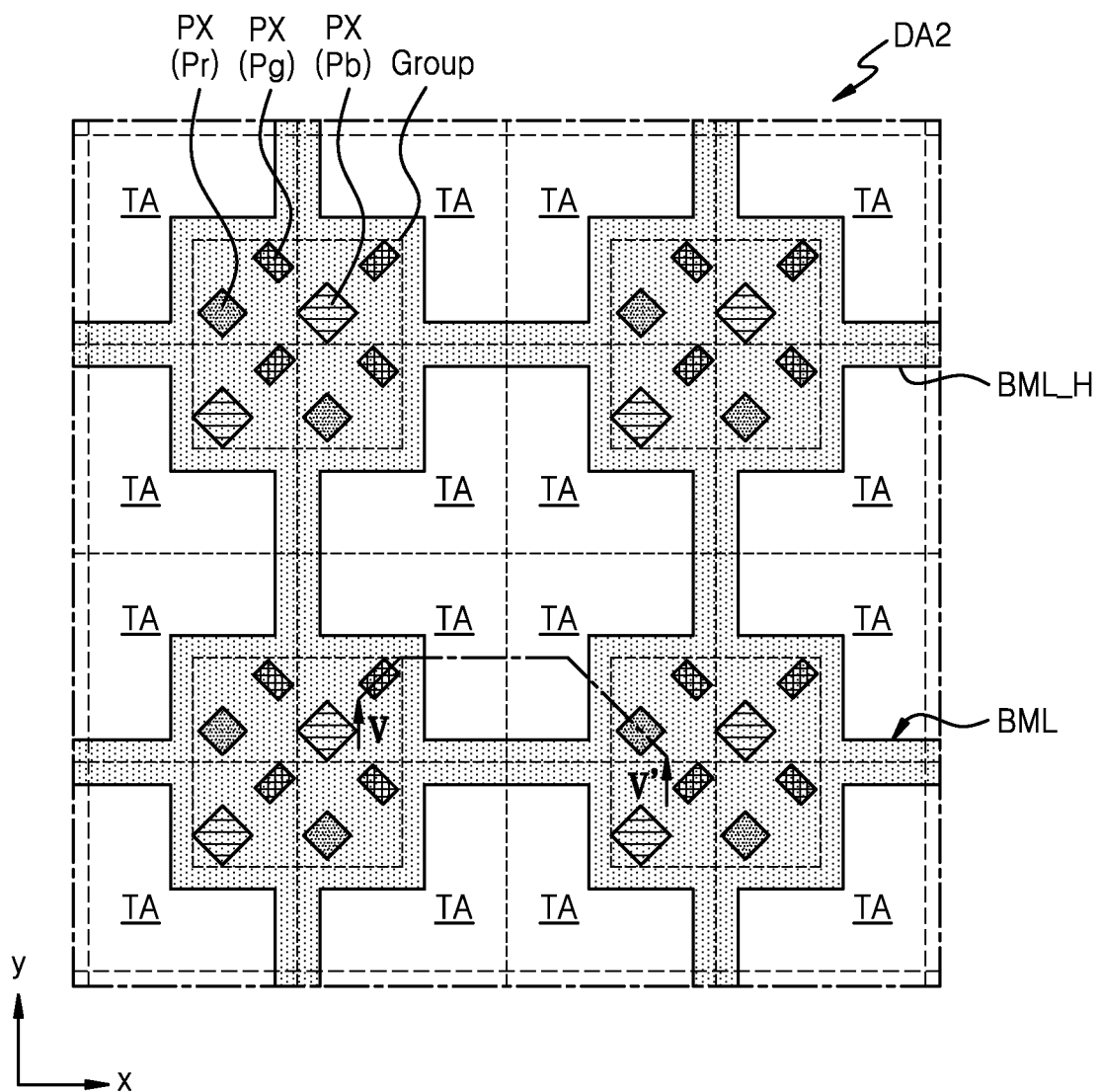

FIGS. 4A and 4B are schematic plan views respectively illustrating arrangements of pixels in the first display area and the second display area of the electronic apparatus, according to an embodiment.

Referring to FIGS. 4A and 4B, the pixels PX are arranged in the first display area DA1 and the second display area DA2. The pixels PX may include a red pixel Pr, a green pixel Pg, and a blue pixel Pb. In some embodiments, as illustrated in FIGS. 4A and 4B, the red pixel Pr, the green pixel Pg, and the blue pixel Pb may be arranged in a Pentile form. In another embodiment, the red pixel Pr, the green pixel Pg, and the blue pixel Pb may be arranged in a stripe form.

The red pixel Pr, the green pixel Pg, and the blue pixel Pb may have different sizes (or widths). For example, the blue pixel Pb may be larger than the red pixel Pr and the green pixel Pg, and the red pixel Pr may be larger than the green pixel Pg. In some embodiments, a shape of the green pixel Pg may be a rectangle and neighboring green pixels Pg may extend in different directions.

Referring to FIG. 4B, the second display area DA2 may include transmission areas TA. In the second display area DA2, the transmission areas TA may be adjacent to the pixels PX arranged in the second display area DA2. For example, the pixels PX in the second display area DA2 may include at least two pixels PX that are separated from each other with the transmission area TA disposed therebetween. The second display area DA2 includes the transmission area TA, and thus, the number of pixels PX per the same area in the second display area DA2 may be less than the number of pixels PX per the same area in the first pixel area DA1.

For example, FIG. 4B illustrates that eight pixels PX form one group in the second display area DA2, and neighboring groups are arranged with the transmission area TA disposed therebetween. Also, one group may be at least partially surrounded by four transmission areas TA that has an L shape. However, one or more embodiments are not limited thereto, and the number of pixels PX included in one group may vary according to a resolution of the second display area DA2. Also, a shape of the transmission area TA disposed to surround the one group in a plan view may be variously modified and designed.

Meanwhile, in the same area, the number of lines (not shown) arranged in the second display area DA2 may be less than the number of lines (not shown) arranged in the first display area DAL Here, the lines may be signal lines configured to provide electrical signals or power lines configured to provide power to the pixel circuit PC (see FIG. 3). In detail, in the same area, the number of pixel circuits PC disposed in the second display area DA2 is less than the number of pixel circuits PC disposed in the first display area DA1, and thus, the number of lines arranged in the second display area DA2 may also be less than the number of lines arranged in the first display area DA1. Also, the lines arranged in the first display area DA1 may bypass the second display area DA2 and extend to prevent the lines from being arranged in the second display area DA2. By reducing the number of lines arranged in the second display area DA2, an area occupied by the lines in the second display area DA2 may be reduced, and the transmission area TA of the second display area DA2 may increase. Thus, the light transmittance of the second display area DA2 may be improved.

The lower metal layer BML may be arranged in the second display area DA2. The lower metal layer BML may overlap the pixels PX in the second display area DA2. Also, although not shown in FIG. 4B, the lower metal layer BML may overlap the pixel circuit PC arranged in the second display area DA2 and lines electrically connected to the pixel circuit PC.

The lower metal layer BML may include an opening BML_H exposing the transmission area TA of the second display area DA2. Thus, the degradation in the transmittance of light passing through the transmission area TA may be reduced. A shape of the lower metal layer BML in a plan view may vary according to shapes and arrangements of the pixels PX and the transmission areas TA of the second display area DA2.

Figure 5:
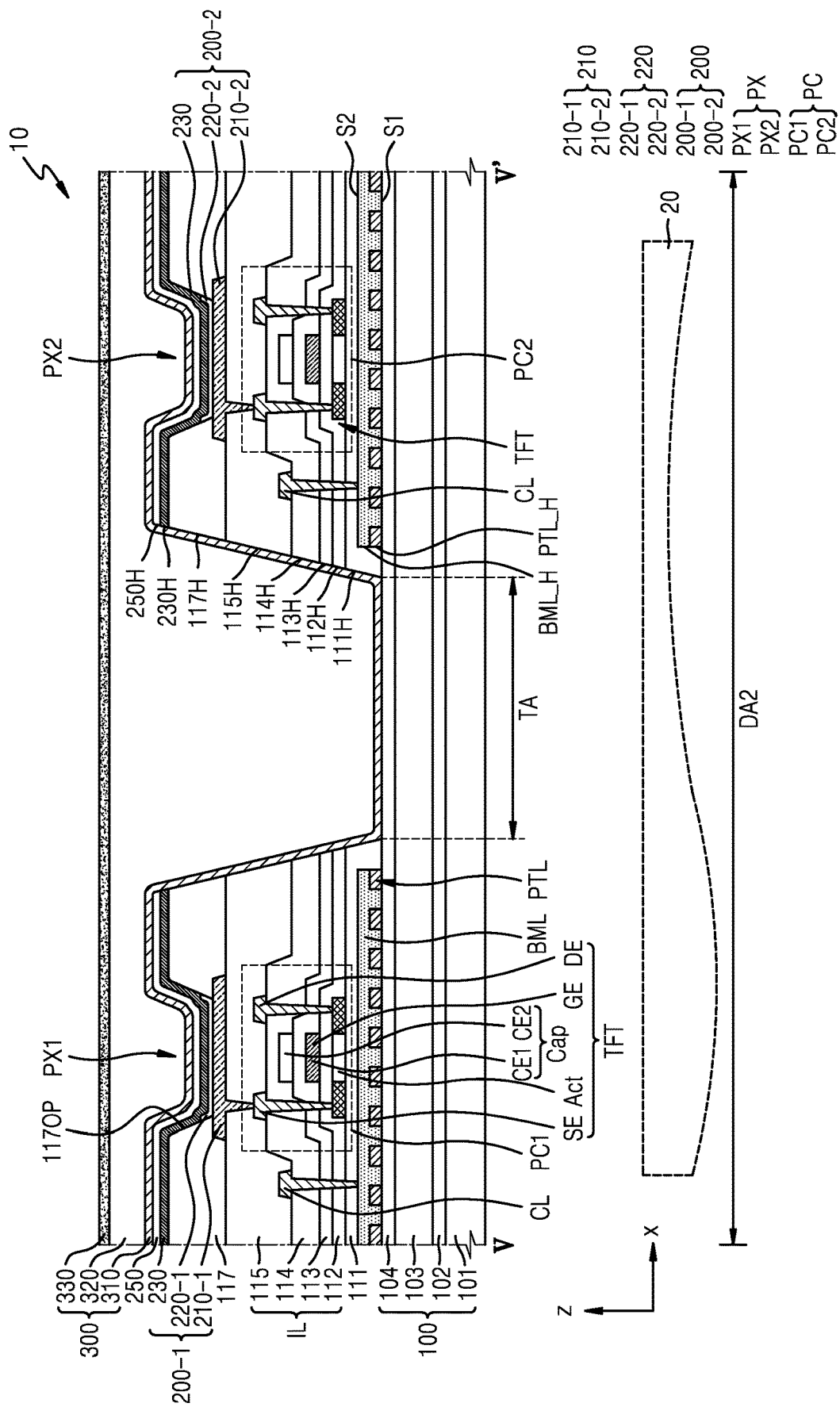
FIG. 5 is a schematic cross-sectional view illustrating part of a display apparatus of an electronic apparatus, according to an embodiment.

FIG. 5 is a schematic cross-sectional view illustrating part of a display apparatus of an electronic apparatus according to an embodiment and corresponds to a cross-section of part of the display apparatus, taken along a line V-V' of FIG. 4B.

Referring to FIG. 5, in an embodiment, the substrate 100 may have a multilayered structure including a base layer including polymer resin and a barrier layer including an inorganic insulating layer. For example, the substrate 100 may include a first base layer 101, a first barrier layer 102, a second baes layer 103, and a second barrier layer 104 that are sequentially stacked. The first base layer 101 and the second base layer 103 may each include PES, PAR, PEI, PEN, PET, PPS, polyarylate, PI, PC, CAP, or the like. The first barrier layer 102 and the second barrier layer 104 may each include silicon oxide, silicon oxynitride, and/or silicon nitride.

The buffer layer 111 may be arranged on the substrate 100. The buffer layer 111 may decrease or prevent the penetration of foreign materials, moisture, or external air into the substrate 100 from a lower portion of the substrate 100 and may provide a flat surface on the substrate 100. The buffer layer 111 may include an inorganic insulating material such as silicon oxide, silicon oxynitride, and silicon nitride and may have a monolayer structure or a multilayered structure including the aforementioned material(s).

The pixel circuit PC may be arranged on the buffer layer 111. As described above, the pixel circuit PC may include the thin film transistors TFT and the storage capacitor Cap. The pixel circuit PC of the display apparatus 10 may be provided in plural.

In an embodiment, because the second display area DA2 includes the transmission area TA, the pixel circuits PC in the second display area DA2 may include a first pixel circuit PC1 and a second pixel circuit PC2 that are spaced apart from each other with the transmission area TA disposed therebetween.

The thin film transistor TFT may include a semiconductor layer Act, a gate electrode GE overlapping a channel area of the semiconductor layer Act, and a source electrode SE and a drain electrode DE respectively connected to a source area and a drain area of the semiconductor layer Act. A first gate insulating layer 112 may be arranged between the semiconductor layer Act and the gate electrode GE, and a second gate insulating layer 113 and an interlayer insulating layer 114 may be arranged between the gate electrode GE and the source electrode SE or between the gate electrode GE and the drain electrode DE.

The storage capacitor Cap may overlap the thin film transistor TFT. The storage capacitor Cap may include a first charging plate CE1 and a second charging plate CE2 that overlap each other. In some embodiments, the gate electrode GE of the thin film transistor TFT may include the first charging plate CE1 of the storage capacitor Cap. The second gate insulating layer 113 may be arranged between the first charging plate CE1 and the second charging plate CE2.

The semiconductor layer Act may include polysilicon. In some embodiments, the semiconductor layer Act may include amorphous silicon. In some embodiments, the semiconductor layer Act may include at least one oxide selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel area and a source area and a drain area doped with impurities.

The first gate insulating layer 112 may include inorganic insulating materials such as silicon oxide, silicon oxynitride, and silicon nitride, and have a monolayer structure or multilayered structure including the aforementioned materials.

The gate electrode GE1 or the first charging plate CE1 may include a low-resistance conductive material such as molybdenum (Mo), aluminum (Al), copper (Cu), and/or titanium (Ti) and may have a monolayer structure or a multilayered structure including the above material(s).

The second gate insulating layer 113 may include the inorganic insulating materials such as silicon oxide, silicon oxynitride, and silicon nitride and may have a monolayer structure or a multilayered structure including the above material(s).

The second charging plate CE2 may include Al, platinum (Pt), palladium (Pd), silver (Ag), magnesium (Mg), gold (Au), nickel (Ni), neodymium (Nd), iridium (Ir), Cr, calcium (Ca), molybdenum (Mo), Ti, tungsten (W) and/or Cu and may have a monolayer structure or a multilayered structure including the above material(s).

The interlayer insulating layer 114 may include the inorganic insulating materials such as silicon oxide, silicon oxynitride, and silicon nitride and may have a monolayer structure or a multilayered structure including the above material(s).

The source electrode SE or the drain electrode DE may include Al, Pt, Pd, Ag, Mg, Au, Ni, Nd, Ir, Cr, Ni, Ca, Mo, Ti, W, and/or Cu and may have a monolayer structure or a multilayered structure including the above material(s). For example, the source electrode SE or the drain electrode DE may have a three-layer structure of a Ti layer/an Al layer/a Ti layer.

A conductive layer CL may be arranged on the interlayer insulating layer 114. The conductive layer CL may include the same material as the source electrode SE or the drain electrode DE. The conductive layer CL may be electrically connected to the source electrode SE or the drain electrode DE. For example, the conductive layer CL may be integrally formed with the source electrode SE or the drain electrode DE.

The conductive layer CL may contact the lower metal layer BML through a contact hole formed in the first gate insulating layer 112, the second gate insulating layer 113, and the interlayer insulating layer 114. The lower metal layer BML may receive a constant voltage, and electrical characteristics of the thin film transistor TFT disposed on the lower metal layer BML may be stabilized. In an embodiment, the conductive layer CL may receive the driving voltage ELVDD from the driving power line PL (see FIG. 3), and the lower metal layer BML may receive the driving voltage EVLDD through the conductive layer CL. The constant voltage may not be limited to the driving voltage EVLDD and may include signals transmitted to control the pixel circuit PC.

A planarization layer 115 may be disposed on the conductive layer CL, the source electrode SE and the drain electrode DE on the first gate insulating layer 112, the second gate insulating layer 113, and the interlayer insulating layer 114. The planarization layer 115 may cover the pixel circuit PC. The planarization layer 115 may include an organic insulating material. The planarization layer 115 may include an organic insulating material such as acryl, benzocyclobutene (BCB), PI, or hexamethyldisiloxane (HMDSO). The organic insulating material of the planarization layer 115 may be a photosensitive organic insulating material. The planarization layer 115 may provide a flat surface on an upper surface thereof.

A pixel electrode 210 may be disposed on the planarization layer 115. That is, the planarization layer 115 may be arranged between the thin film transistor TFT and the pixel electrode 210 of the pixel circuit PC. The pixel electrode 210 may be electrically connected to the pixel circuit PC including the thin film transistor TFT and the storage capacitor Cap through the contact hole formed in the planarization layer 115. In an embodiment, the display apparatus 10 may include a first pixel electrode 210-1 and a second pixel electrode 210-2 that are arranged in the second display area DA2 and spaced apart from each other with the transmission area TA disposed therebetween. The first pixel electrode 210-1 and the second pixel electrode 210-2 may be electrically connected to the first pixel circuit PC1 and the second pixel circuit PC2, respectively.

The pixel electrode 210 may include a reflection layer including Ag, Mg, Al, Pt, Pd, Au, Ni, Nd, Ir, Cr, or a combination thereof. The pixel electrode 210 may include a reflection layer including the above material and a transparent conductive layer arranged on and/or under the reflection layer. The transparent conductive layer may include indium tin oxide (ITO), indium zinc oxide (IZO), zinc oxide (ZnO), indium oxide ($In_2O_3$), indium gallium oxide (IGO), aluminum zinc oxide (AZO), or the like. In an embodiment, the pixel electrode 210 may have a three-layer structure including an ITO layer/an Ag layer/an ITO layer.

A pixel-defining layer 117 may be arranged on the pixel electrode 210. The pixel-defining layer 117 may cover an edge of the pixel electrode 210 and may include an opening 1170P exposing a central portion of the pixel electrode 210. The pixel-defining layer 117 may prevent arcs, etc. from being generated at edges of the pixel electrode 210 by increasing a distance between the edges of the pixel electrode 210 and an opposite electrode 230 disposed above the pixel electrode 210. The pixel-defining layer 117 may include an organic insulating material such as PI, polyamide, acryl resin, BCB, HMDSO, and phenol resin and may be formed by using a spin coating method, etc.

An intermediate layer 220 is arranged on the pixel-defining layer 117 to correspond to the pixel electrode 210. The intermediate layer 220 may include a polymer organic material or a low-molecular weight organic material that emits light of a certain color. In an embodiment, the display apparatus 10 may include a first intermediate layer 220-1 and a second intermediate layer 220-2 that are arranged in the second display area DA2 and are apart from each other with the transmission area TA disposed therebetween. In an embodiment, the first intermediate layer 220-1 and the second intermediate layer 220-2 may correspond to the first pixel electrode 210-1 and the second pixel electrode 210-2, respectively.

The opposite electrode 230 is disposed on the intermediate layer 220. The opposite electrode 230 may include a conductive material having a relatively low work function. For example, the opposite electrode 230 may include a (translucent) transparent layer including Ag, Mg, Al, Ni, Cr, Li, Ca, or a combination thereof. Alternatively, the opposite electrode 230 may further include a layer such as ITO, IZO, ZnO, or $In_2O_3$ on the (translucent) transparent layer including the above material. In an embodiment, the opposite electrode 230 may include Ag and Mg. The opposite electrode 230 may be integrally formed to entirely cover the first display area DA1 and the second display area DA2 except the transparent area TA.

A stack structure of the pixel electrode 210, the intermediate layer 220, and the opposite electrode 230 may form the organic light-emitting diode OLED as the light-emitting element 200. The organic light-emitting diode OLED may emit red light, green light, or blue light, and an emission area of each organic light-emitting diode OLED corresponds to the pixel PX. Because the opening 1170P of the pixel-defining layer 117 defines a size and/or a width of the emission area, a size and/or a width of the pixel PX may depend on a size and/or a width of the opening 1170P of the corresponding pixel-defining layer 117.

In an embodiment, the display apparatus 10 may include a first light-emitting element 200-1 and a second light-emitting element 200-2 that are arranged in the second display area DA2 and spaced apart from each other with the transmission area TA disposed therebetween. As described above, the first light-emitting element 200-1 and the second light-emitting element 200-2 may each be the organic light-emitting diode OLED. The first light-emitting element 200-1 may have a stack structure including the first pixel electrode 210-1, the first intermediate layer 220-1, and the opposite electrode 230, and the second light-emitting element 200-2 may have a stack structure including the second pixel electrode 210-2, the second intermediate layer 220-2, and the opposite electrode 230.

A capping layer 250 may be formed on the opposite electrode 230. The capping layer 250 may include LiF. Alternatively, the capping layer 250 may include an inorganic insulating material such as silicon nitride and/or an organic insulating material. In a selective embodiment, the capping layer 250 may be omitted.

For example, the thin film encapsulation layer 300 may be disposed on the capping layer 250. The organic light-emitting diode OLED may be covered by the thin film encapsulation layer 300. As described above, the thin film encapsulation layer 300 may include the first and second inorganic encapsulation layers 310 and 330 and the organic encapsulation layer 320 disposed therebetween.

The first and second inorganic encapsulation layers 310 and 330 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed according to a chemical vapor deposition method.

The organic encapsulation layer 320 may include a polymer-based material. The polymer-based material may include acryl-based resin, epoxy-based resin, PI, and polyethylene, and the like. For example, the organic encapsulation layer 320 may include acryl-based resin, for example, poly methyl methacrylate (PMMA), polyacrylate, or the like. The organic encapsulation layer 320 may be formed by hardening a monomer or spreading a polymer thereon.

The buffer layer 110 and the insulating layer IL arranged between the substrate 100 and the pixel electrode 210 may include holes formed corresponding to the transmission areas TA. For example, the buffer layer 111 on the substrate 100 may include a first hole 111H corresponding to the transmission area TA. The first gate insulating layer 112, the second gate insulating layer 113, the interlayer insulating layer 114, and the planarization layer 115 may include second to fifth holes 112H to 115H formed corresponding to the transmission areas TA and overlapping each other. Also, sublayers of the pixel-defining layer 117, the opposite electrode 230, the capping layer 250, and the thin film encapsulation layer 300 may respectively include holes formed corresponding to the transmission areas TA. For example, the pixel-defining layer 117, the opposite electrode 230, the capping layer 250 may respectively include sixth, seventh, and eighth holes 119H, 230H, and 250H that are arranged in the transmission areas TA and overlap each other.

The first, second, third, fourth, fifth, sixth, seventh, and eighth holes 111H, 112H, 113H, 114H, 115H, 117H, 230H, and 250H overlap each other, and thus, the light transmittance of the transmission areas TA may be improved.

According to an embodiment, the display apparatus 10 may include the lower metal layer BML arranged under the light-emitting element 200. As illustrated in FIG. 5, the lower metal layer BML may be arranged under the first light-emitting element 200-1 and the second light-emitting element 200-2. The pixel circuit PC electrically connected to the light-emitting element 200 may be arranged between the light-emitting element 200 and the lower metal layer BML. For example, the first pixel circuit PC1 may be arranged between the first light-emitting element 200-1 and the lower metal layer BML, and the second pixel circuit PC2 may be arranged between the second light-emitting element 200-2 and the lower metal layer BML. In other words, the lower metal layer BML may be arranged under the pixel circuit PC. The lower metal layer BML may be arranged between the substrate 100 and the pixel circuit PC. For example, the lower metal layer BML may be disposed between the substrate 100 and the buffer layer 111. According to an embodiment, the lower metal layer BML may overlap at least the pixel circuit PC. For example, a portion of the lower metal layer BML may overlap the first pixel circuit PC1, and another portion of the lower metal layer BML may overlap the second pixel circuit PC2.

The lower metal layer BML may include a low-resistance conductive material such as Mo, Al, Cu, and/or Ti and may have a monolayer structure or a multilayered structure including the above material(s). Also, the lower metal layer BML may include a light shield material, for example, black ink or pigment.

As described above, the lower metal layer BML may include the opening BML_H through which the light from or towards the electronic component 20 may pass. The opening BML_H of the lower metal layer BML may correspond to the transmission area TA. To this end, the degradation of the light transmittance in the transmission area TA due to the lower metal layer BML may be prevented.

The lower metal layer BML may prevent external light from being diffracted when the external light passes through a portion between conductive layers forming the pixel circuit PC and lines (not shown) and prevent the diffracted light from reaching the electronic component 20. Also, the lower metal layer BML may prevent the light, which is emitted from or towards the electronic component 20, from being incident to the thin film transistor TFT arranged in the second display area DA2. Thus, the performance degradation of the thin film transistor TFT may be prevented or decrease.

The light, which is emitted from the electronic component 20 or incident onto the display apparatus 10 from outside, may be reflected from a first surface S1 of the lower metal layer BML and may be incident to the electronic component 20 again. The first surface S1 of the lower metal layer BML may be a surface facing the substrate 100. In this case, the reflected light that is incident to the electronic component 20 again may degrade the performance of the electronic component 20. For example, when the electronic component 20 is an image sensor such as a camera, the electronic component 20 may receive the reflected light and an image captured by the electronic component 20 may have a blurred pattern of the lower metal layer BML or may cause a ghost image problem.

To solve the problems, the first surface S1 of the lower metal layer BML may be modified to have uneven portions. A surface roughness of the first surface S1 of the lower metal layer BML may be greater than a surface roughness of a second surface S2 that is opposite to the first surface S1. In this case, when the light emitted from the electronic component 20 or incident onto the display apparatus 10 from outside is reflected from the first surface S1 of the lower metal layer BML, the light may be diffusely reflected or scattered. To this end, the performance degradation of the electronic component 20, which results from the reflected light of the first surface S1 of the lower metal layer BML, may be prevented or decrease.

According to an embodiment, to form the uneven portions on the first surface S1 of the lower metal layer BML, a pattern layer PTL may be arranged between the substrate 100 and the lower metal layer BML. The pattern layer PTL may include a certain fine pattern and may be formed of a material different from that of the lower metal layer BML and the second barrier layer 104. For example, the pattern layer PTL may include inorganic insulating materials such as silicon oxide, silicon oxynitride, and silicon nitride. As another example, the pattern layer PTL may include amorphous silicon. The pattern layer PTL may have good etching selectivity to a layer disposed thereunder to prevent a damage to the layer disposed thereunder, for example, the second barrier layer 104. For example, when the second barrier layer 104 is a silicon oxide, the pattern layer PTL may be a silicon nitride. For example, when the second barrier layer 104 is a silicon nitride, the pattern layer PTL may be a silicon oxide.

In an embodiment, the pattern layer PTL may include openings PTL_H each disposed corresponding to the transmission area TA. The openings PTL_H of the pattern layer PTL may be disposed corresponding to the openings BML_H of the lower metal layer BML. Thus, the degradation in the light transmittance of the transmission area TA due to the pattern layer PTL may be prevented.

A structure in which the first surface S1 of the lower metal layer BML having the uneven portions will be described below in detail.

Figure 6A:
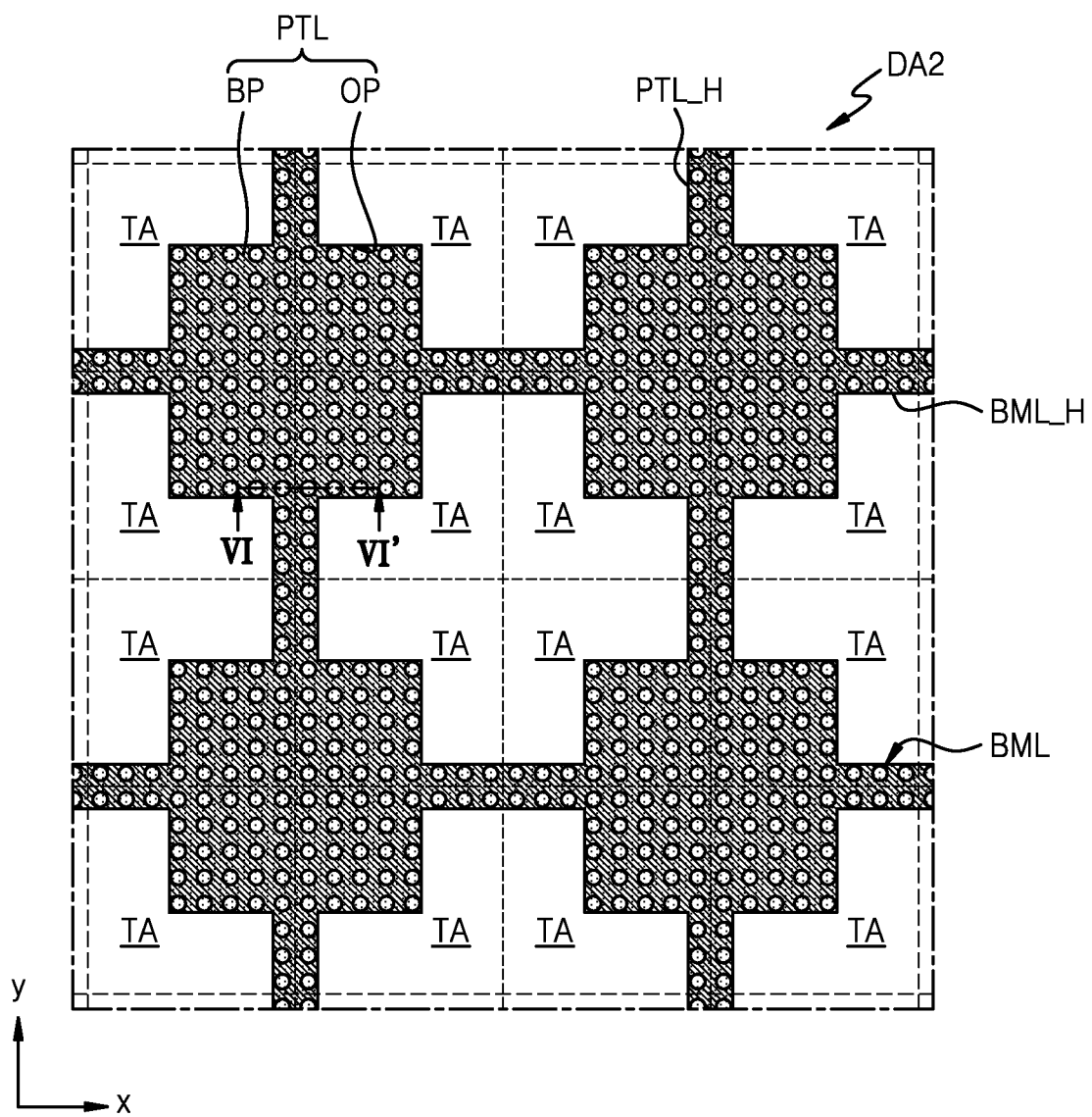
FIGS. 6A and 6B are a schematic plan view and a schematic cross-sectional view respectively illustrating a lower metal layer and a pattern layer of an electronic apparatus, according to an embodiment.
Figure 6B:
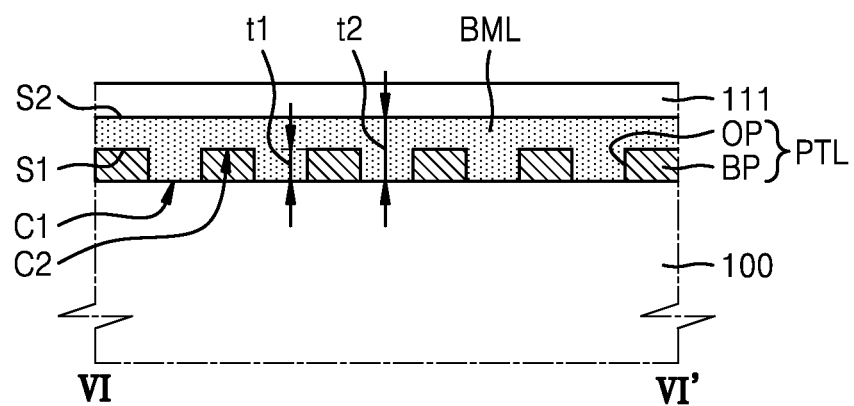

FIGS. 6A and 6B are a schematic plan view and a schematic cross-sectional view respectively illustrating a lower metal layer and a pattern layer of an electronic apparatus, according to an embodiment. FIG. 6A illustrates arrangements of a lower metal layer and a pattern layer, and FIG. 6B illustrates a cross-section of the lower metal layer and the pattern layer, taken along a line VI-VI' of FIG. 6A.

Referring to FIG. 6A, the pattern layer PTL may be disposed correspond to the lower metal layer BML. Here, the term "correspond" may indicate that a component may overlap another component in a direction perpendicular to a surface of the substrate 100 (see FIG. 5). As illustrated in FIG. 6A, in a plan view, an edge of the pattern layer PTL may correspond to an edge of the lower metal layer BML. The opening PTL_H of the pattern layer PTL may substantially the same as the opening BML_H of the lower metal layer BML. Here, the expression "in a plan view" may indicate "on a virtual plane parallel to a surface of the substrate 100." However, one or more embodiments are not limited thereto. As another example, the edge of the pattern layer PTL may be exposed by an edge of the lower metal layer BML. In another example, the edge of the pattern layer PTL may be disposed inside of the edge of the lower metal layer BML.

In an embodiment, the pattern layer PTL may include a body portion BP and pattern openings OP. The pattern openings OP may be disposed to be spaced apart from each other, and at least some of the pattern openings OP may be surrounded by the body portion BP. As illustrated in FIG. 6A, a shape of each pattern opening OP may be a circle in a plan view. However, one or more embodiments are not limited thereto. In the plan view, the shape of each pattern opening OP may be an oval or a polygon such as a triangle or a square.

For example, the pattern openings OP of the pattern layer PTL may have matrix configuration arranged along a row direction and a column direction. As another example, the pattern openings OP may be two-dimensionally arranged but may randomly arranged on the plan view.

Referring to FIG. 6B, the first surface S1 of the lower metal layer BML may include convex portions C1 and concave portions C2, and the convex portions C1 and the concave portions C2 define the uneven portions of the first surface S1. The convex portions C1 may protrude towards the substrate 100 from the lower metal layer BML, and the concave portions C2 may be recessed from the convex portions C1 and disposed between neighboring convex portions C1. That is, as the convex portions C1 and the concave portions C2 are alternately arranged, the uneven portions of the first surface S1 may be formed.

On the contrary, the second surface S2 of the lower metal layer BML may have a relatively flat surface. Therefore, the surface roughness of the second surface S2 of the lower metal layer BML may be less than that of the first surface S1. Here, the surface roughness may be measured targeting a surface of a sample having a certain area by using an Atomic Force Microscopy (AFM). The surface roughness may be expressed as arithmetical mean roughness, root mean square average roughness, maximum height roughness, or the like.

In an embodiment, a thickness t1 of the pattern layer PTL may be less than a thickness T2 of the lower metal layer BML. Thus, the second surface S2 of the lower metal layer BML may have a relatively flat surface which does not have the uneven portion and may have a continuous surface. For example, the thickness t1 of the pattern layer PTL may be between about 50 Å and about 1000 Å, between about 50 Å and about 500 Å, between about 50 Å and about 400 Å, or between about 50 Å and about 200 Å. A thickness of the lower metal layer BML may be equal to or greater than about 1000 Å, about 500 Å, about 400 Å, or about 200 Å. Here, a thickness unit Å denote angstrom.

The convex portions C1 of the first surface S1 of the lower metal layer BML may fill the pattern openings OP of the pattern layer PTL. The body portion BP of the pattern layer PTL may be arranged in the concave portions C2 of the first surface S1 of the lower metal layer BML. In an embodiment, the pattern openings OP of the pattern layer PTL may be through holes formed through the pattern layer PTL in a thickness direction thereof. Here, the thickness direction may be a direction perpendicular to a surface of the substrate 100. In this case, part of the upper surface of the substrate 100 may be exposed by the pattern openings OP, and thus, the convex portions C1 of the lower metal layer BML may contact the part of the upper surface of the substrate 100 in the pattern openings OP. That is, a portion of the first surface S1 of the lower metal layer BML may contact the substrate 100, and another portion of the first surface S1 may contact the pattern layer PTL. The second surface S2 of the lower metal layer BML may contact the buffer layer 111.

As described above, because of the pattern layer PTL has a certain opening pattern, the first surface S1 of the lower metal layer BML may include uneven portions defined by the convex portions C1 of the concave portions C2.

Figure 7A:
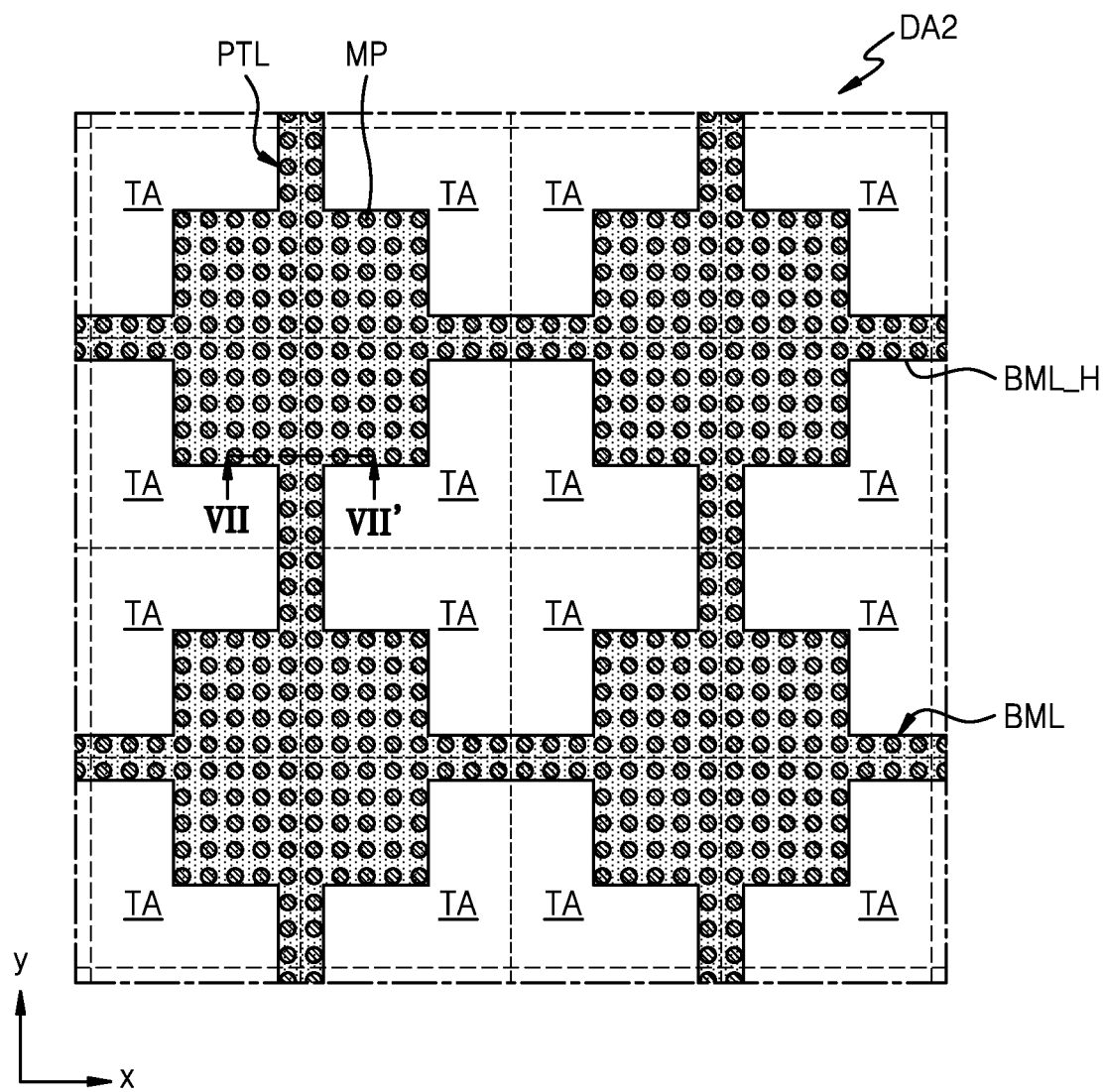
FIGS. 7A and 7B are a schematic plan view and a schematic cross-sectional view respectively illustrating a lower metal layer and a pattern layer of an electronic apparatus, according to another embodiment.
Figure 7B:
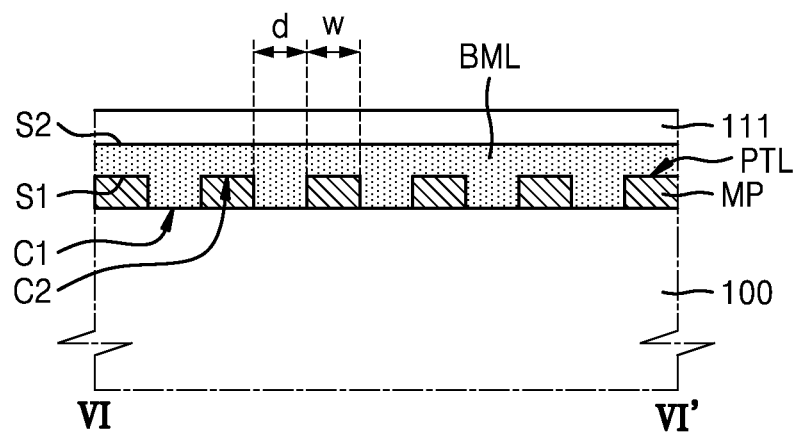

FIGS. 7A and 7B are a schematic plan view and a schematic cross-sectional view respectively illustrating a lower metal layer and a pattern layer of an electronic apparatus, according to another embodiment. FIG. 7A illustrate arrangements of a lower metal layer and a pattern layer, and FIG. 7B illustrate a cross-section of the lower metal layer and the pattern layer, taken along a line VII-VII' of FIG. 7A. The descriptions provided above with reference to FIGS. 6A and 6B will not be provide again, and a difference between FIGS. 6A to 7B will be mainly described.

First of all, referring to FIG. 7A, the pattern layer PTL may include pattern material portions MP arranged apart from each other in a plan view. For example, the pattern material portions MP may each be in an island form or an isolated form. As illustrated in FIG. 7A, a shape of each pattern material portion MP may be a circle in the plan view. However, one or more embodiments are not limited thereto. In a plan view, the pattern material portion MP may be an oval or a polygon such as a triangle or a rectangle.

For example, the pattern material portions MP of the pattern layer PTL may form a matrix configuration arranged along a row direction and a column direction. As another example, the pattern material portions MP may be two-dimensionally arranged or may be randomly arranged in a plan view.

Referring to FIG. 7B, the pattern material portions MP of the pattern layer PTL which are disposed adjacent to each other may be disposed to be spaced apart from each other by a certain distance d. The pattern material portions MP may have a certain width w, for example, the width w of between about 1 μm and about 20 μm. Here, a width unit μm may indicate a micrometer.

The convex portions C1 of the first surface S1 of the lower metal layer BML may each be disposed between the pattern material portions MP of the pattern layer PTL. The pattern material portions MP of the pattern layer PTL may be in the concave portions C2 on the first surface S1 of the lower metal layer BML. Part of the upper surface of the substrate 100 may be exposed through gaps between the pattern material portions MP, and thus, the convex portions C1 of the lower metal layer BML may contact the part of the upper surface of the substrate 100 between the pattern material portions MP. That is, a portion of the first surface S1 of the lower metal layer BML may contact the substrate 100, and another portion of the first surface S1 may contact the pattern layer PTL. The second surface S2 of the lower metal layer BML may contact the buffer layer 111.

Figure 8:
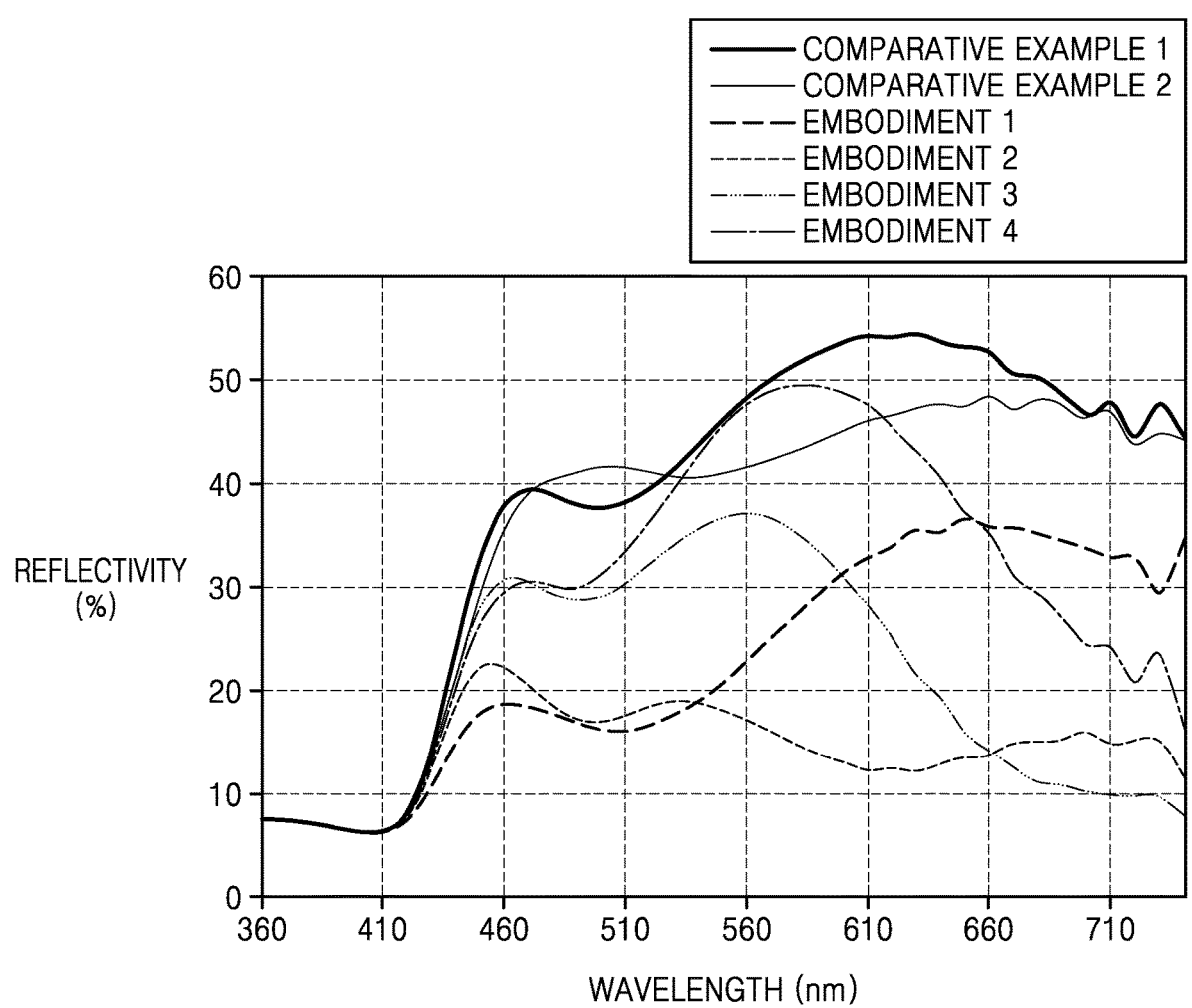
FIG. 8 is a graph illustrating a reflectivity according to wavelengths on a surface of a lower metal layer of each electronic apparatus, according to embodiments and comparative examples.

FIG. 8 is a graph illustrating a reflectivity according to wavelengths on a surface of a lower metal layer of each electronic apparatus, according to embodiment and comparative examples.

Referring to FIG. 8, the horizontal axis of the graph indicates a wavelength of light and a wavelength unit is a nanometer (nm). The vertical axis of the graph indicates Specular Component Included (SCI) reflectivity. That is, the light reflectivity in the graph indicates reflectivity including regular reflection light and diffusely reflected light.

The graph of FIG. 8 is a graph obtained by measuring the reflectivity of light from the first surface S1 (see FIG. 5) when the light is emitted on the first surface S1 of the lower metal layer BML (see FIG. 5). The measurement of the reflectivity is performed by using a spectrum colorimeter (CM-2600) manufactured by Konica Minolta. Comparative examples 1 and 2 indicate that the pattern layer PTN which is formed of amorphous silicon are not arranged under the lower metal layer BML. Embodiments 1 to 4 indicate the pattern layer PTN which is formed of amorphous silicon layers are arranged under the lower metal layer BML, and thicknesses of the amorphous silicon layers differ from each other. The amorphous silicon layer in Embodiment 1 has a thickness of 100 Å, the amorphous silicon layer in Embodiment 2 has a thickness of 200 Å, the amorphous silicon layer in Embodiment 3 has a thickness of 300 Å, and the amorphous silicon layer in Embodiment 4 has a thickness of 400 Å. The pattern layer PTL (see FIG. 5) according to an embodiment may include the amorphous silicon layer, as described above.

In Comparative Examples 1 and 2, the reflectivity of light having a wavelength of 460 nm or greater may be approximately 40% or greater. On the contrary, in Embodiments 1 to 4, the reflectivity of light having a wavelength of 460 nm or greater may be less than or equal to about 40%. When the amorphous silicon layer having a thickness of 400 Å or less is provided, the reflectivity may be low compared to when an amorphous silicon layer is not included. Especially in Embodiment 2, the reflectivity of light having a wavelength of 460 nm or greater may be less than or equal to about 20%.

As shown in Graph of FIG. 8, when the lower metal layer BML includes the amorphous silicon layer, the reflectivity of light may decrease.

As the reflectivity of light on the first surface S1 of the lower metal layer BML is great, the amount of reflected light, which is incident again to the electronic component 20 (see FIG. 5) and causes the degradation in performance of the electronic component 20, may increase. Because light having a wavelength of 460 nm or greater includes visible rays, when the electronic component 20 is an image sensor such as a camera, the quality of captured images may be degraded because of the reflected light.

To solve the aforementioned problems, the thickness t1 of the pattern layer PTL of the electronic apparatus 1 according to an embodiment may be between about 50 Å and about 400 Å, between about 50 Å and about 300 Å, or between about 50 Å and about 200 Å.

FIGS. 9A to 9F are schematic cross-sectional views illustrating some of manufacturing processes of an electronic apparatus, according to an embodiment.

Figure 9A:
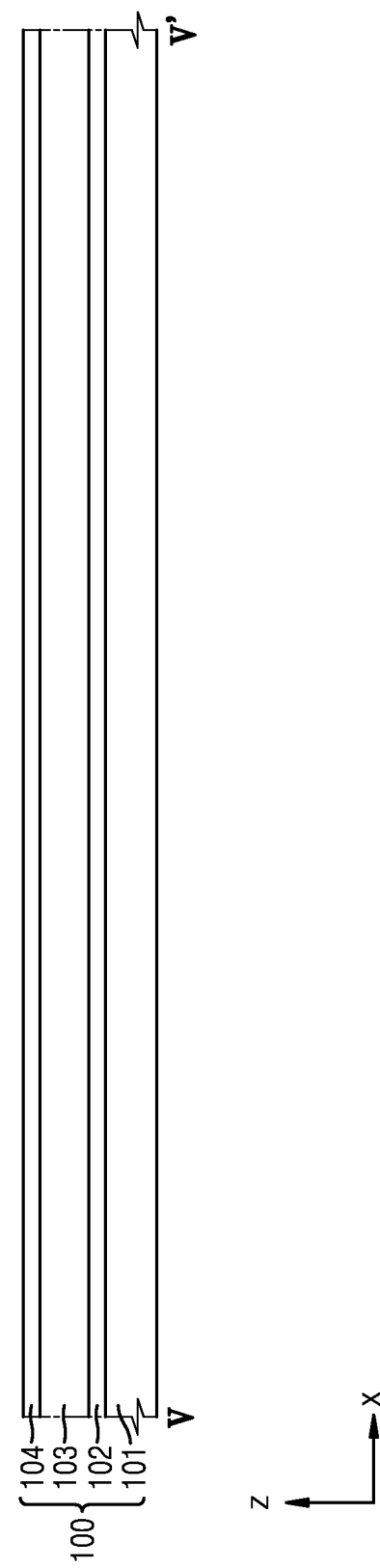
FIGS. 9A, 9B, 9C, 9D, 9E and 9F are schematic cross-sectional views illustrating some of manufacturing processes of an electronic apparatus, according to an embodiment.

Referring to FIG. 9A, the substrate 100 may be prepared. As described above, the substrate 100 may have a stack structure including the first base layer 101, the first barrier layer 102, the second base layer 103, and the second barrier layer 104, and thus, the first base layer 101, the first barrier layer 102, the second base layer 103, and the second barrier layer 104 may be sequentially formed. The first base layer 101 and the second base layer 103 may include polymer resin, and the first barrier layer 102 and the second barrier layer 104 may include inorganic insulating materials.

Figure 9B:
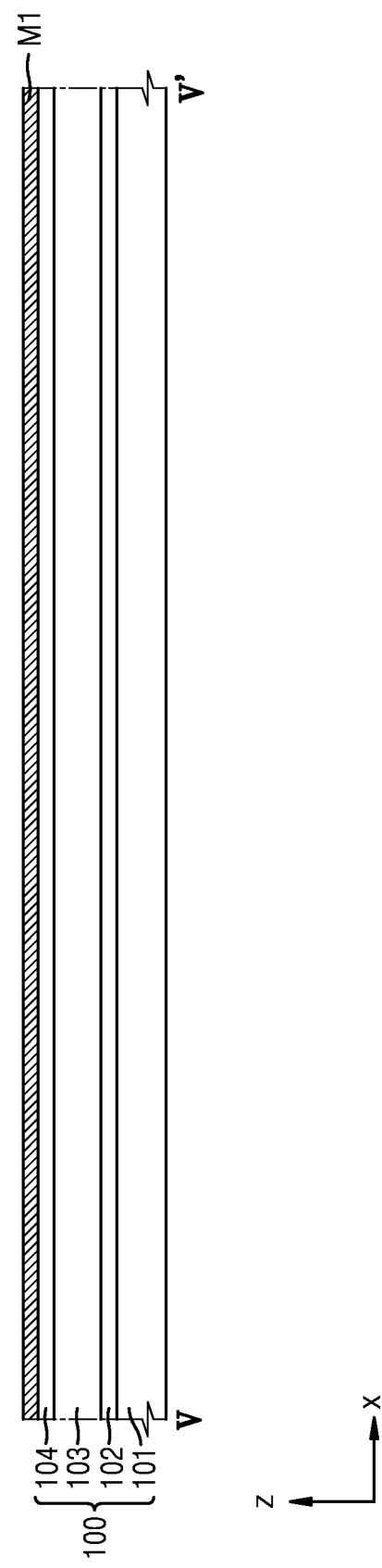

Referring to FIG. 9B, a first material layer M1 may be formed on the substrate 100. The first material layer M1 may include, for example, inorganic insulating materials such as silicon oxide, silicon oxynitride, and silicon nitride. As another example, the first material layer M1 may include amorphous silicon. The first material layer M1 may be formed according to a deposition method, for example, a chemical vapor deposition (CVD) method, a thermal chemical vapor deposition (TCVD) method, a plasma enhanced chemical vapor deposition (PECVD) method, or the like. The first material layer M1 may have good etching selectivity to the second barrier layer 104.

Figure 9C:
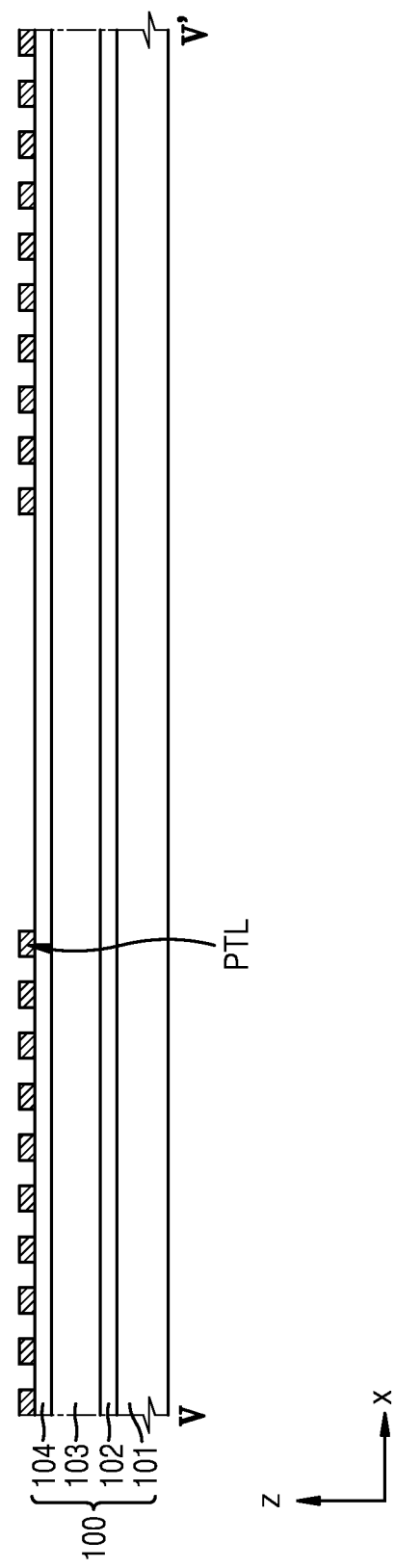

Referring to FIG. 9C, the pattern layer PTL having a certain pattern may be formed by removing a portion of the first material layer M1. The removed portion may include a portion of the first material layer M1 which corresponds to the transmission area TA (see FIG. 5), and a portion of the lower metal layer BML (see FIGS. 6B and 7B) corresponding to the convex portions C1 (see FIGS. 6B and 7B).

For example, photolithography and etching processes may be used to form the pattern layer PTL. In detail, a photoresist (not shown) may be coated on the first material layer M1. Then, the photoresist may be exposed to light by using a mask having a pattern and developed, and thus, a photoresist pattern having a pattern corresponding to the pattern of the mask may be formed. Then, the first material layer M1 may be etched by using the photoresist pattern as an etch mask. Thus, the first material layer M1 may include a certain pattern. The etching process may be a dry etching process or a wet etching process.

Figure 9D:
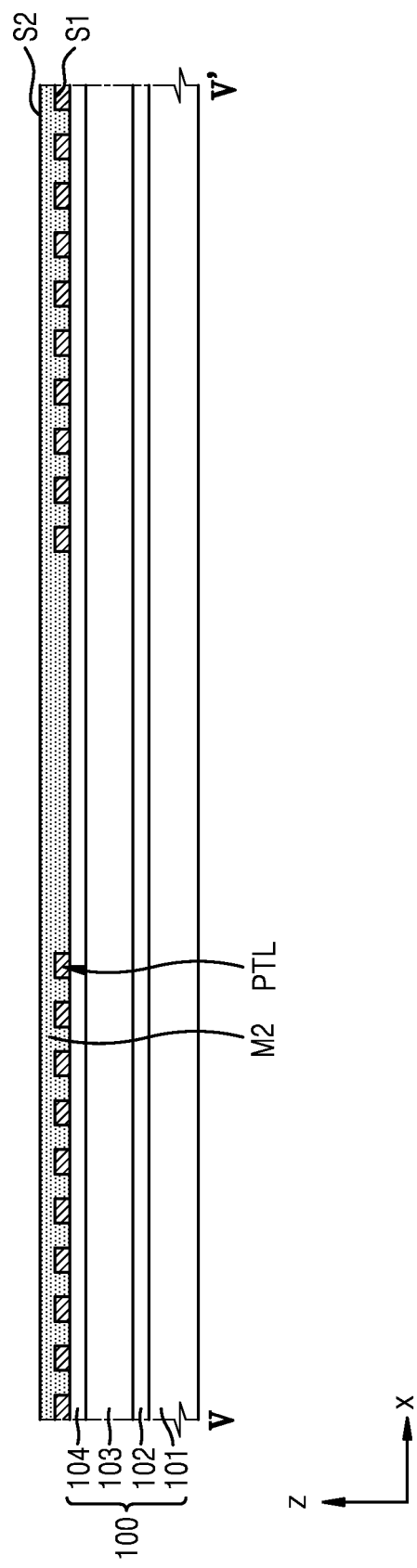

Referring to FIG. 9D, a second material layer M2 may be formed on the pattern layer PTL. The second material layer M2 may include a different material from the first material layer M1. For example, the second material layer M2 may include a low-resistance conductive material such as Mo, Al, Cu, and/or Ti and may also include a light shield material, for example, black ink or pigment. The second material layer M2 may be formed according to a deposition method, for example, a CVD method, a TCVD method, a PECVD method, a sputtering method, an e-beam evaporation method, or the like.

Figure 9E:
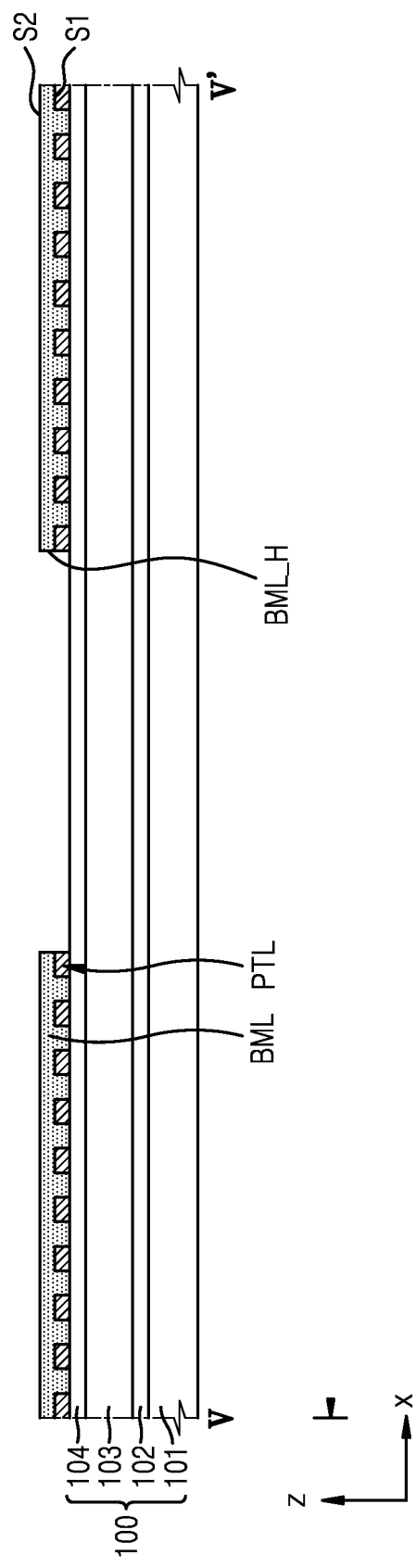

Referring to FIG. 9E, the lower metal layer BML may be formed by removing a portion of the second material layer M2. The removed portion may include a portion of the second material layer M2 that corresponds to the transmission area TA. For example, the lower metal layer BML may be formed by using the photolithography process and the etching process.

Figure 9F:
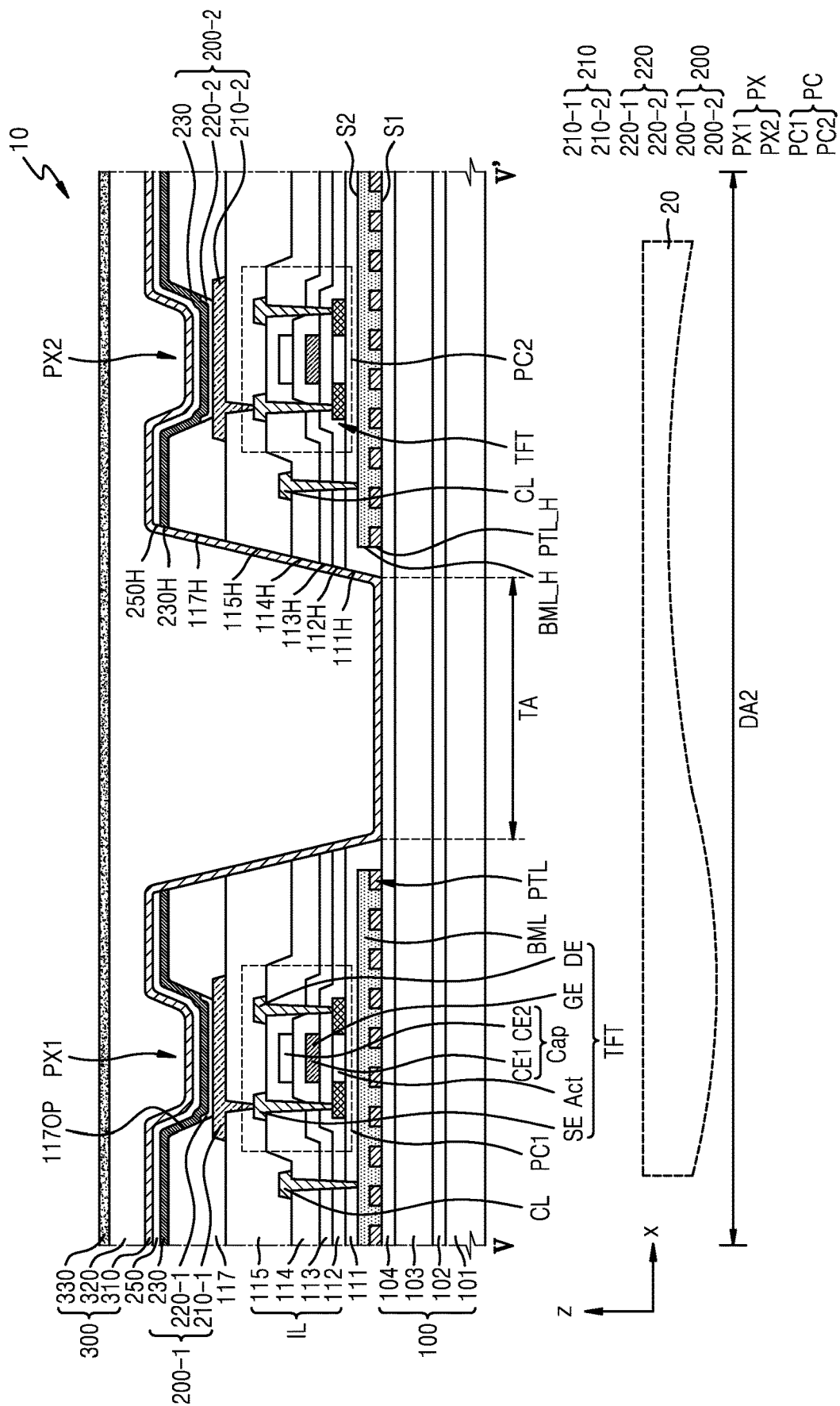

Referring to FIG. 9F, the buffer layer 111 may be formed on the lower metal layer BML to cover the same. On the buffer layer 111, the insulating layers IL and the pixel circuit PC including the thin film transistor TFT and the storage capacitor Cap may be formed. Then, the organic light-emitting diode OLED, which is the light-emitting element 200 and electrically connected to the pixel circuit PC, may be formed. In detail, the pixel electrode 210 electrically connected to the pixel circuit PC may be formed, and the pixel-defining layer 117 partially covering the pixel electrode 210 may be formed. Then, the organic light-emitting diode OLED may be formed by forming the intermediate layer 220 and the opposite electrode 230. Then, the capping layer 250, the thin film encapsulation layer 300, and the like that cover the organic light-emitting diode OLED may be formed. Through the above processes, the display apparatus according to an embodiment may be manufactured.

Figure 10:
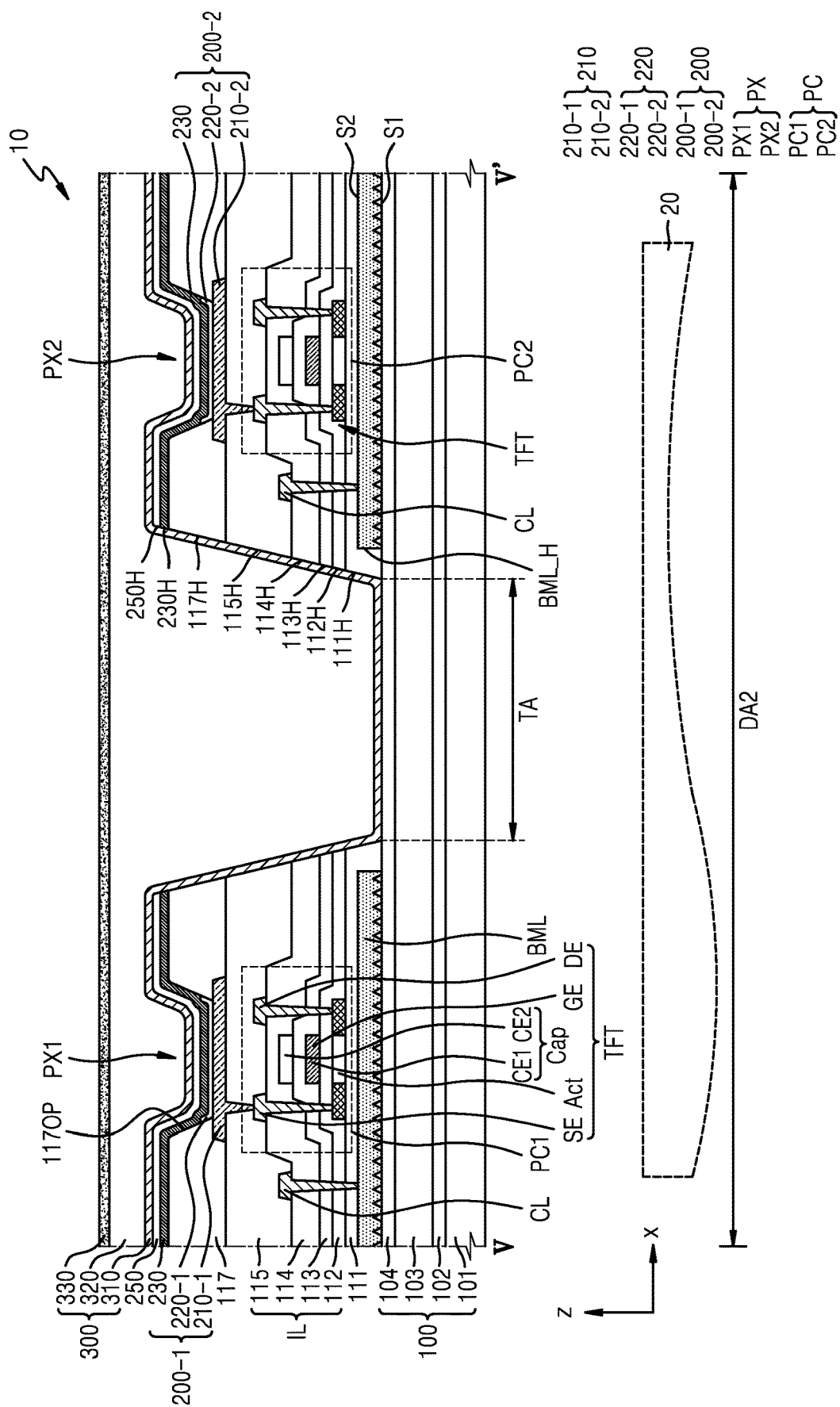
FIG. 10 is a schematic cross-sectional view illustrating part of an electronic apparatus according to another embodiment.

FIG. 10 is a schematic cross-sectional view illustrating part of an electronic apparatus according to another embodiment. Like reference symbols will be used for reference symbols, which are the same as those in FIG. 5 or correspond thereto, and descriptions thereof will be omitted.

Referring to FIG. 10, the display apparatus 10 may include the lower metal layer BML disposed between the substrate 100 and the pixel circuit PC, but a separate component may not exist between the lower metal layer BML and the substrate 100. Nonetheless, the first surface S1 of the lower metal layer BML may include the uneven portions, and the surface roughness of the first surface S1 of the lower metal layer BML may be greater than that of the second surface S2 of the lower metal layer BML.

Thus, when the light emitted from the electronic component 20 or light incident onto the display apparatus 10 from outside is reflected from the first surface S1 of the lower metal layer BML, the light may be diffusely reflected or scattered. Therefore, the performance degradation in the electronic component 20, which results from the light reflected from the first surface S1 of the lower metal layer BML, may be prevented or decrease.

Hereinafter, referring to FIGS. 11A to 11D, a manufacturing method of the display apparatus of FIG. 10 will be described in detail.

FIGS. 11A to 11D are schematic cross-sectional views illustrating some of manufacturing processes of an electronic apparatus, according to another embodiment.

Figure 11A:
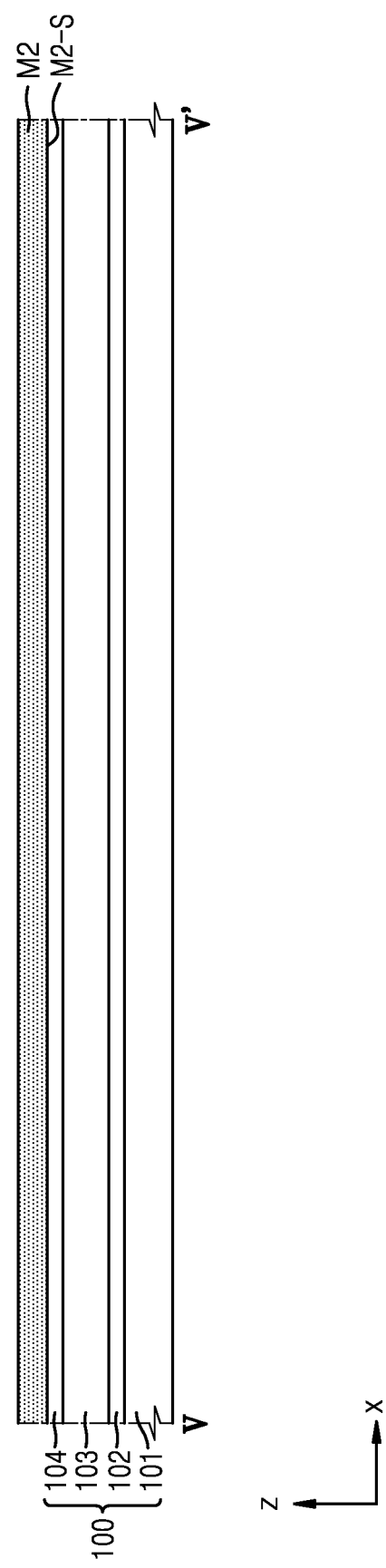
FIGS. 11A, 11B, 11C and 11D are schematic cross-sectional views illustrating some of manufacturing processes of an electronic apparatus, according to another embodiment.

Referring to FIG. 11A, the substrate 100 may be prepared. Then, the second material layer M2 may be formed on the substrate 100. The second material layer M2 may include a lower surface M2-S contacting the substrate 100.

The second material layer M2 may include, for example, a low-resistance conductive material such as Mo, Al, Cu, and/or Ti, and may also include a light shield material, for example, black ink or pigment.

The second material layer M2 may be formed according to a deposition method, for example, a CVD method, a TCVD method, a PECVD method, a sputtering method, an e-beam evaporation method, or the like.

Figure 11B:
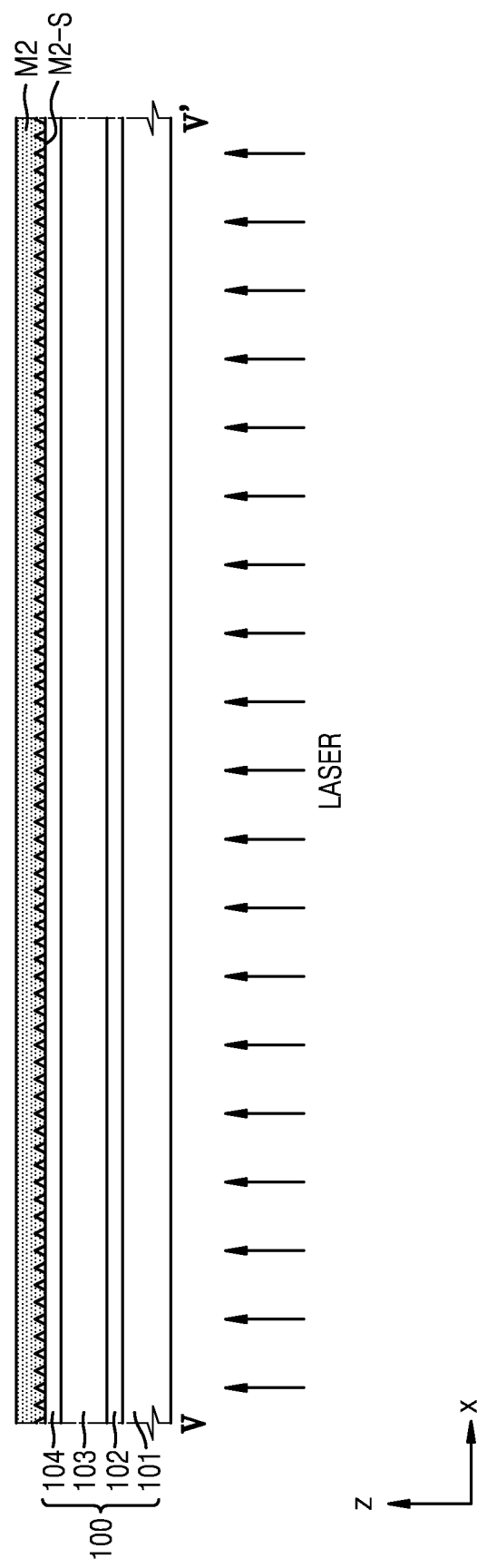

Referring to FIG. 11B, by irradiating laser to the lower surface M2-S of the second material layer M2 through the substrate 100, uneven portions may be formed on the lower surface M2-S of the second material layer M2. For example, the laser used may be Excimer laser. Alternatively, a type of laser may be $CO_2$ laser, YAG laser, nano-second laser, femto-second laser, Bessel beam, Gaussian beam, or the like.

The efficiency in which laser is absorbed, transmittance of laser, and the like may differ according to materials. According to an embodiment, laser in a certain wavelength band, which has a low absorption ratio in the substrate 100 including polymer resin (that is, high transmittance) but has a high absorption ratio in the second material layer M2, may be used. The laser in a certain wavelength band may reach the lower surface M2-S of the second material layer M2 through the substrate 100. The laser reaching the lower surface M2-S of the second material layer M2 may be absorbed by the second material layer M2 and converted into heat energy. After all, the second material layer M2 may be partially melted or deformed because of the heat energy, and thus, the uneven portions of the lower surface M2-S of the second material layer M2 may be formed.

The laser may be irradiated in a z-direction, and in this case, a process of turning the substrate 100 may be selectively added.

Figure 11C:
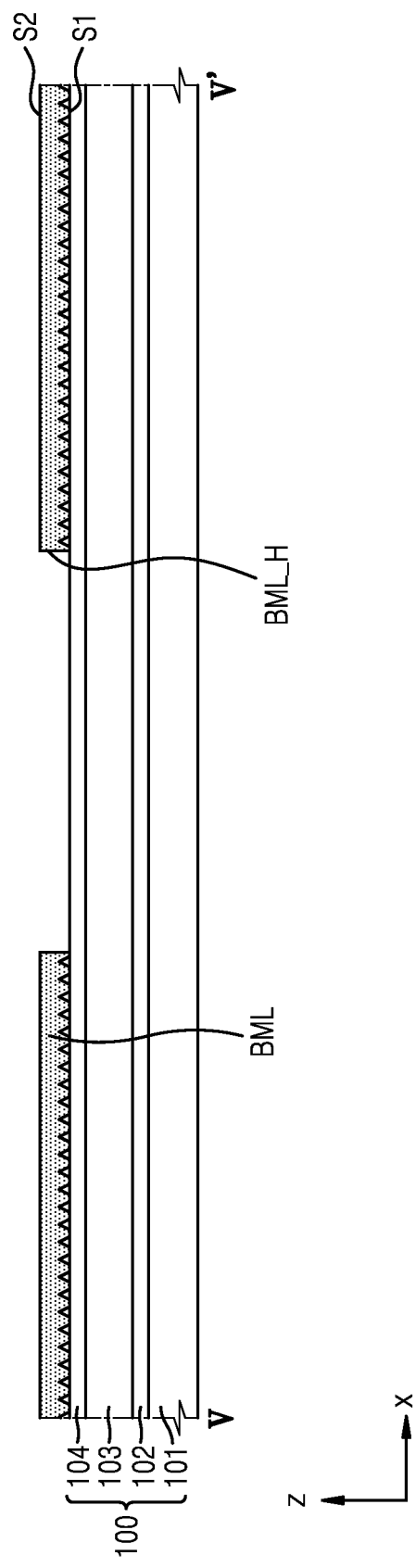

Referring to FIG. 11C, the lower metal layer BML may be formed by removing a portion of the second material layer M2. The removed portion may correspond to the transmission area TA (see FIG. 10). For example, the lower metal layer BML may be formed by using the above-described photolithography and etching processes.

Figure 11D:
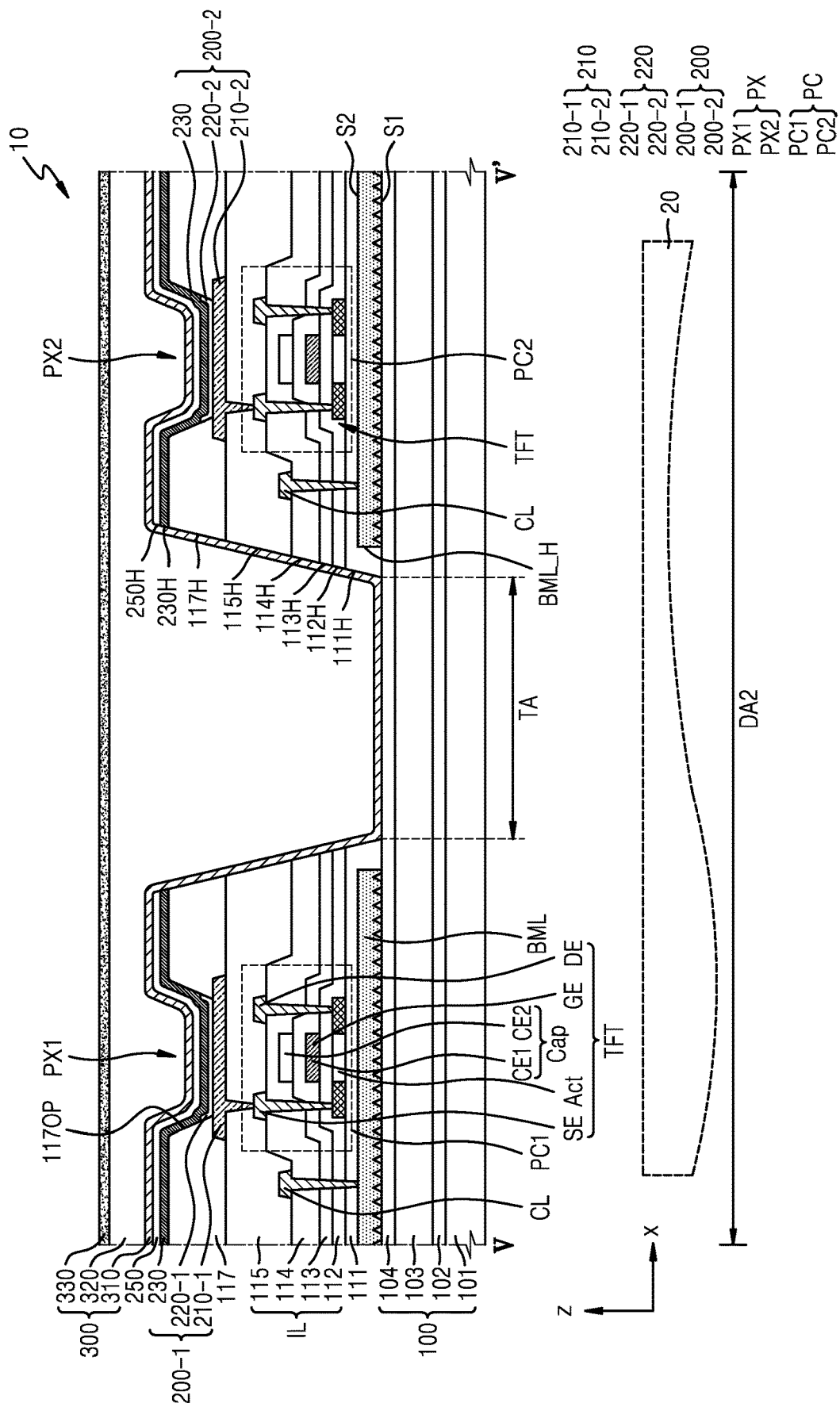

Referring to FIG. 11D, the buffer layer 111 may be formed on the lower metal layer BML to cover the same, and the insulating layers IL, the pixel circuit PC, the organic light-emitting diode OLED that is the light-emitting element 200, and the like may be formed on the buffer layer 111.

Figure 12:
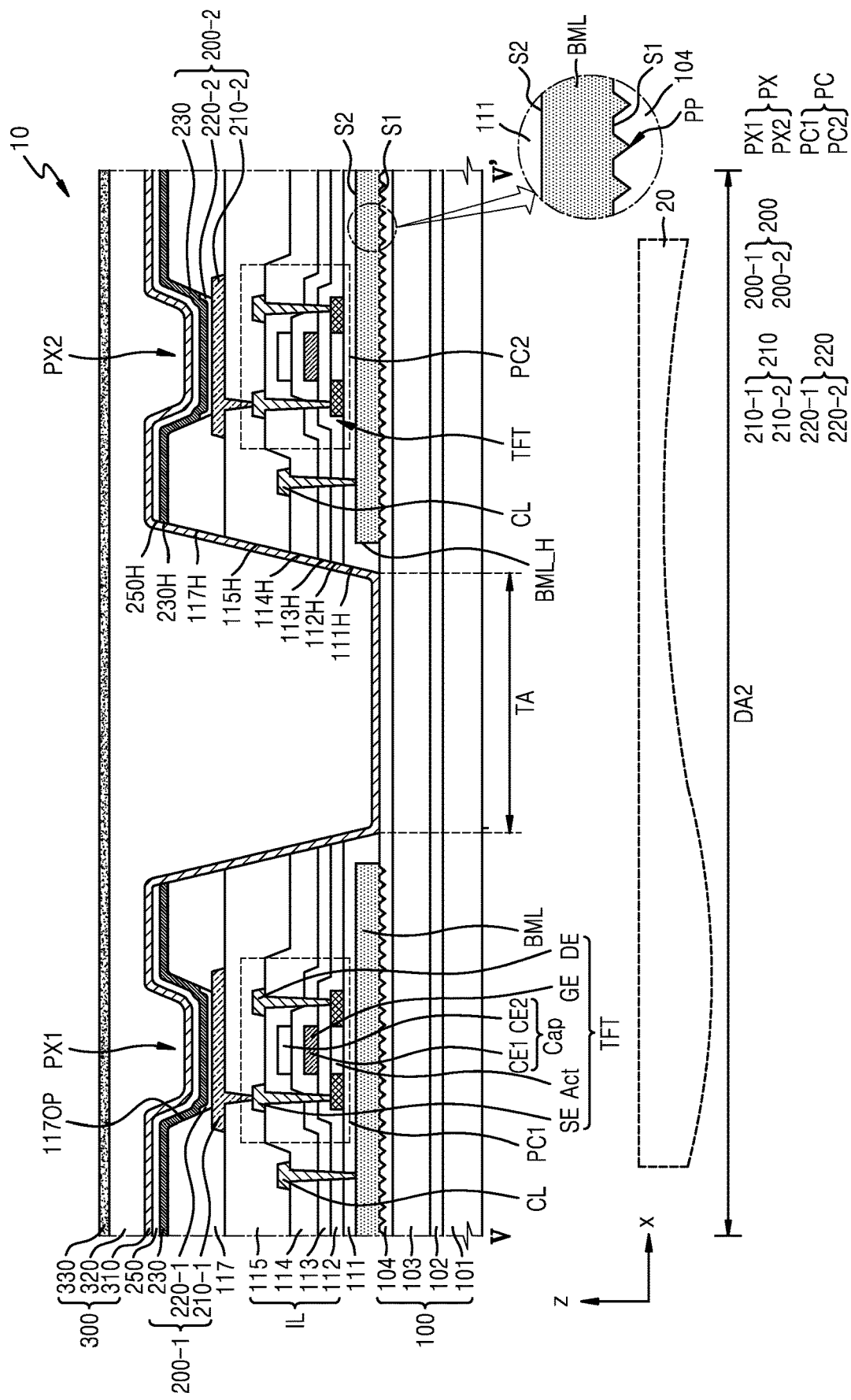
FIG. 12 is a schematic cross-sectional view illustrating part of an electronic apparatus, according to another embodiment.

FIG. 12 is a schematic cross-sectional view illustrating part of an electronic apparatus according to another embodiment. The descriptions provided with reference to FIG. 10 will not be repeated, and a difference between FIGS. 10 and 12 will be mainly described.

Referring to FIG. 12, the first surface S1 of the lower metal layer BML may include the uneven portions and a number of protruding portions PP formed in the second barrier layer 104 of the substrate 100. The protruding portions PP of the lower metal layer BML may be formed because of uneven portions formed on an upper surface of the second barrier layer 104 that the lower metal layer BML directly contacts. That is, the uneven portions formed on the upper surface of the second barrier layer 104 include concave portions, and the protruding portions PP are formed as portions of the lower metal layer BML which fill the concave portions. Because of the protruding portions PP of the lower metal layer BML, the surface roughness of the first surface S1 of the lower metal layer BML may be greater than the surface roughness of the second surface S2 of the lower metal layer BML.

For example, heights of the protruding portions PP formed on the upper surface of the second barrier layer 104 may be less than a thickness of the second barrier layer 104. The heights of the protruding portions PP and arrangements thereof in a plan view may be irregular.

Because the first surface S1 of the lower metal layer BML includes the uneven portions, when the light emitted from the electronic component 20 or the light incident onto the display apparatus 10 from outside is reflected again from the first surface S1 of the lower metal layer BML, the light may be diffusely reflected or scattered. Therefore, the performance degradation of the electronic component 20, which results from the light reflected from the first surface S1 of the lower metal layer BML, may be prevented or decrease.

Hereinafter, referring to FIGS. 13A to 13D, a manufacturing method of the display apparatus of FIG. 12 will be described below in detail.

FIGS. 13A to 13E are schematic cross-sectional views illustrating some of manufacturing processes of an electronic apparatus, according to another embodiment.

Figure 13A:
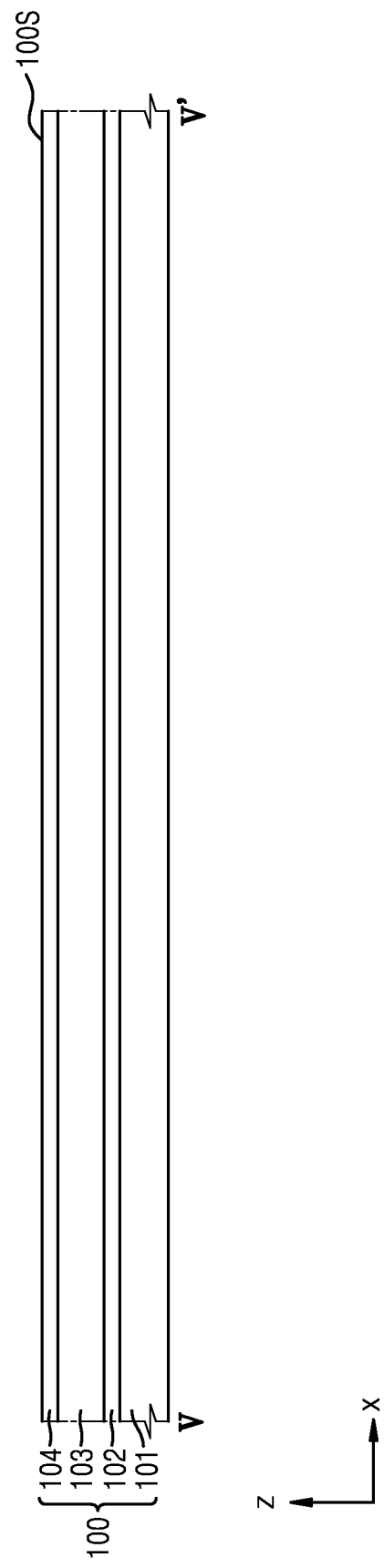

Referring to FIG. 13A, the substrate 100 including an upper surface 100S may be prepared. As described above, the substrate 100 may have the stack structure including the first base layer 101, the first barrier layer 102, the second base layer 103, and the second barrier layer 104. The upper surface 100S of the substrate 100 may be a surface of the second barrier layer 104 arranged on an uppermost portion of the substrate 100. As described above, the second barrier layer 104 may include an inorganic insulating material.

Figure 13B:
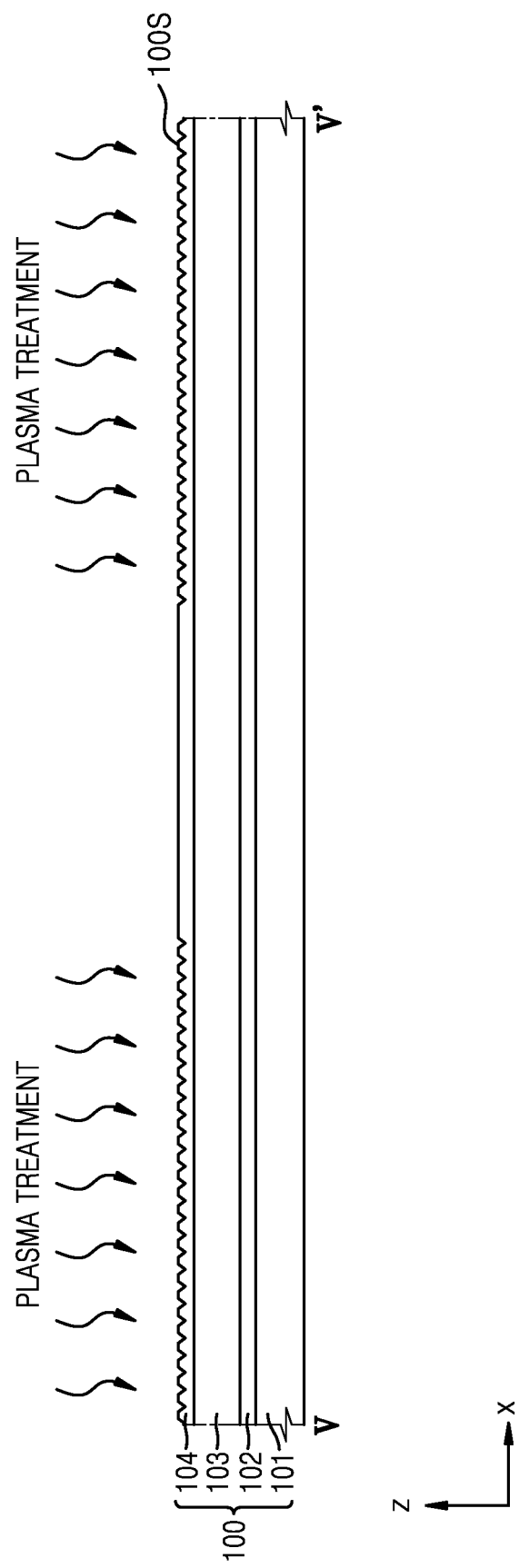

Referring to FIG. 13B, a plasma treatment may be performed on at least some portions of the upper surface 100S of the substrate 100. Here, the plasma treatment may be a process of removing, evaporating, or detaching part of a surface of a target by using an active gas such as $O_2$, $CF_4$, or $SH_6$. Through the plasma treatment, uneven portions may be formed on the upper surface 100S of the substrate 100.

For example, the plasma treatment may be partially performed on regions corresponding to the second display area DA2 where the lower metal layer BML may be eventually formed using a mask which covers the upper surface of the second barrier layer 104 corresponding to the transmission areas TA. As another example, the plasma treatment may be performed on the entire substrate 100. In this case, a surface treatment process such as polishing may be additionally performed to enable at least a portion of the upper surface 100S of the substrate 100 which corresponds to the transmission area TA (see FIG. 12) to be planar.

Figure 13C:
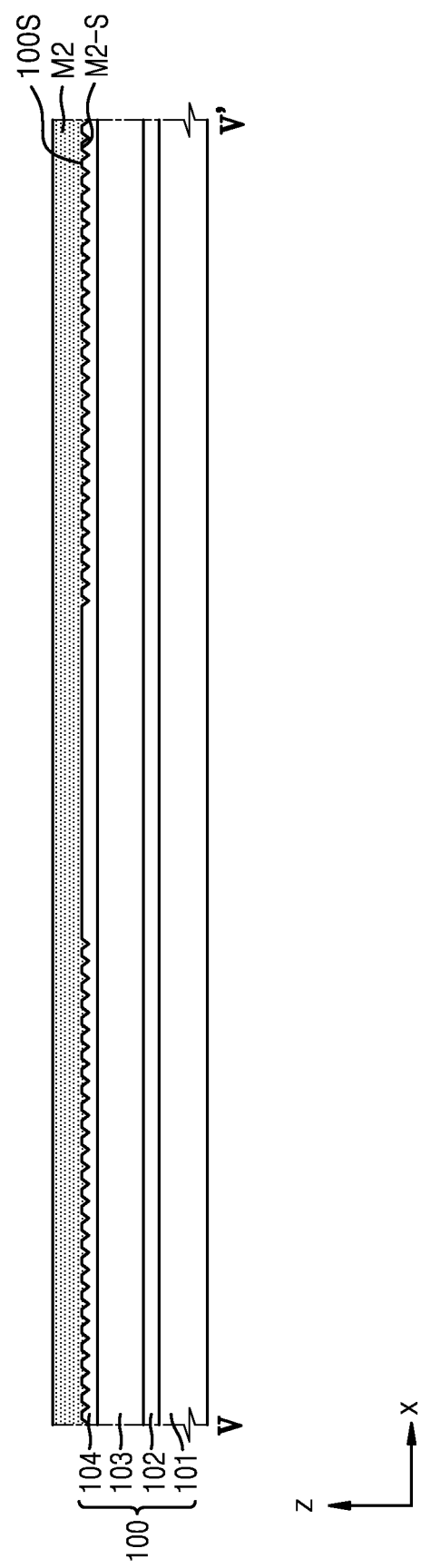

Referring to FIG. 13C, the second material layer M2 may be formed on the substrate 100. Because the second material layer M2 is formed on the upper surface 100S of the substrate 100 including the uneven portions, the concave portions of the uneven portions may be filled with the second material layer M2. Therefore, the lower surface M2-S of the second material layer M2 may contact the upper surface 100S of the substrate 100 and may include the uneven portions corresponding to the uneven portions of the substrate 100.

The second material layer M2 may include, for example, a low-resistance material such as Mo, Al, Cu, and/or Ti, and may also include a light shield material, for example, black ink or pigment.

The second material layer M2 may be formed according to a deposition method, for example, a CVD method, a TCVD method, a PECVD method, a sputtering method, an e-beam evaporation method, or the like.

Figure 13D:
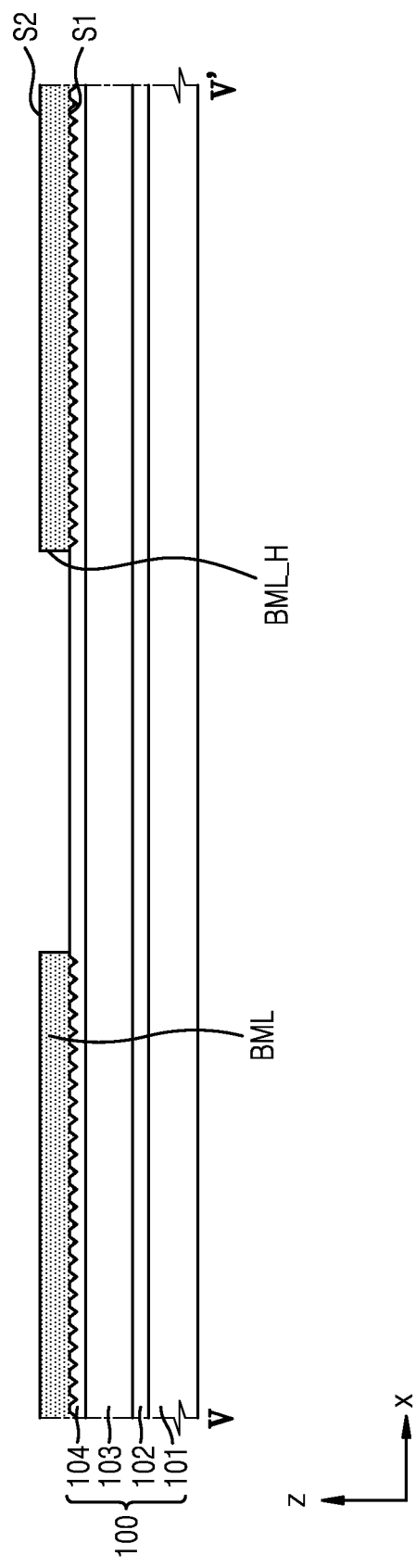

Referring to FIG. 13D, the lower metal layer BML may be formed by removing a portion of the second material layer M2. The removed portion may correspond to the transmission area TA (see FIG. 12). For example, the lower metal layer BML may be formed according to the aforementioned photolithography and etching processes.

Referring to FIG. 13E, the buffer layer 111 covering the lower metal layer BML may be formed on the lower metal layer BML, and the insulating layers IL, the pixel circuit PC, and the organic light-emitting diodes OLED, which is the light-emitting element 200, may be formed on the buffer layer 111.

Figure 14:
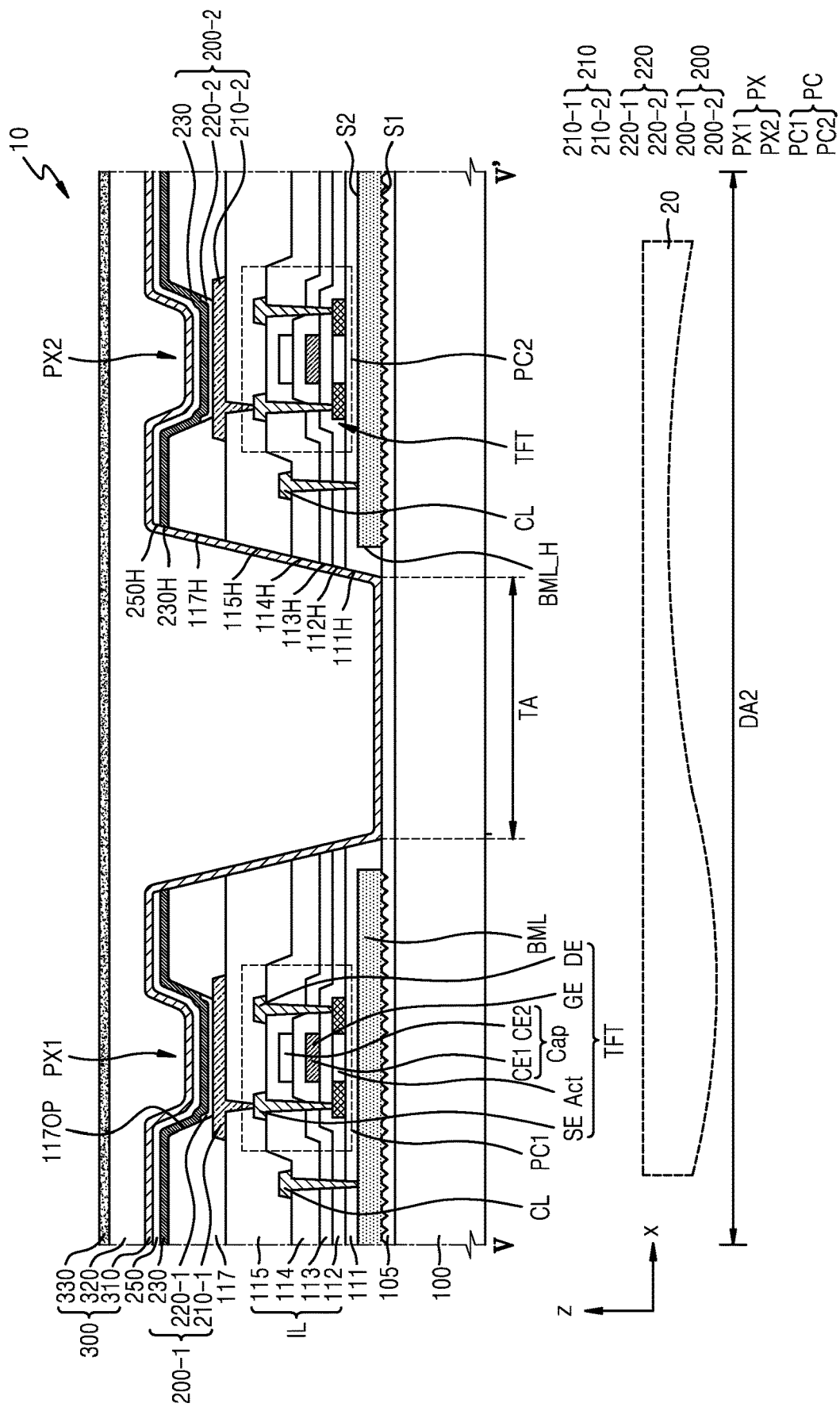
FIG. 14 is a schematic cross-sectional view illustrating part of an electronic apparatus, according to another embodiment.

FIG. 14 is a schematic cross-sectional view illustrating part of an electronic apparatus according to another embodiment. The descriptions provided with reference to FIG. 12 will not be repeated, and a difference between FIGS. 12 and 14 will be mainly described.

Referring to FIG. 14, the display apparatus 10 may include the substrate 100 having a monolayer structure and including glass. In this case, a protection layer 105 may be disposed between the substrate 100 and the lower metal layer BML. The protection layer 105 may include an inorganic insulating material such as silicon oxide, silicon oxynitride, and/or silicon nitride.

The protection layer 105 may correspond to the second barrier layer 104 of the display apparatus 10 of FIG. 12. That is, an upper surface of the protection layer 105 may include uneven portions, and the first surface S1 of the lower metal layer BML may contact the upper surface of the protection layer and may include the uneven portions corresponding to the uneven portions of the protection layer 105.

To this end, the protection layer 105 is formed on the substrate 100, and then the plasma treatment for forming the uneven portions on the upper surface of the protection layer 105 may be performed using a mask which covers the transmission areas TA. Then, the lower metal layer BML may be formed on the protection layer 105. The protection layer 105 may prevent the direct exposure of the substrate 100, which includes a glass material, to plasma during the plasma treatment to protect the substrate 100.

According to the one or more embodiments of the disclosure, by inducing diffuse reflection or scattering of light on a lower surface of a lower metal layer, the degradation in performance of an electronic component by reflected light may be prevented. Thus, a display apparatus, of which a display area is expanded to enable the representation of images in an area where an electronic component is located and in which the degradation in performance of the electronic component is reduced, and a method of manufacturing the display apparatus may be realized. However, the scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising a first display area and a second display area comprising a transmission area, the display apparatus comprising:
- a substrate;
- an insulating layer on the substrate;
- a semiconductor layer on the insulating layer;
- a first light-emitting element and a second light-emitting element that are arranged in the second display area on the substrate and apart from each other with the transmission area between the first light-emitting element and the second light-emitting element; and
- a lower metal layer disposed between the insulating layer and the substrate in the second display,
- wherein the lower metal layer comprises a first surface facing the substrate and a second surface opposite to the first surface, and the first surface of the lower metal layer comprises uneven portions.

2. The display apparatus of claim 1, wherein a surface roughness of the first surface of the lower metal layer is greater than a surface roughness of the second surface of the lower metal layer.

3. The display apparatus of claim 1, further comprising a pattern layer arranged between the substrate and the lower metal layer and including a material different from the lower metal layer.

4. The display apparatus of claim 3, wherein the pattern layer comprises an inorganic insulating material.

5. The display apparatus of claim 3, wherein the pattern layer comprises amorphous silicon.

6. The display apparatus of claim 3, wherein a thickness of the pattern layer is less than a thickness of the lower metal layer.

7. The display apparatus of claim 3, wherein a thickness of the pattern layer is between about 50 Å and about 400 Å.

8. The display apparatus of claim 3, wherein the lower metal layer and the pattern layer each comprise an opening corresponding to the transmission area.

9. The display apparatus of claim 3, wherein a portion of the first surface of the lower metal layer contacts the substrate and another portion of the first surface of the lower metal layer contacts the pattern layer.

10. The display apparatus of claim 3, wherein the pattern layer comprises a body portion and a plurality of pattern openings which are spaced apart from each other and at least some of which are surrounded by the body portion.

11. The display apparatus of claim 10, wherein the first surface of the lower metal layer comprises a plurality of convex portions and a plurality of concave portions and the plurality of convex portions are arranged in the plurality of pattern openings of the pattern layer.

12. The display apparatus of claim 10, wherein each of the plurality of pattern openings of the pattern layer has a circular shape, an oval shape, or a polygonal shape in a plan view.

13. The display apparatus of claim 3, wherein the pattern layer comprises a plurality of pattern material portions that are spaced apart from each other in a plan view and each of the plurality of pattern material portions is in an island form.

14. The display apparatus of claim 13, wherein the first surface of the lower metal layer comprises a plurality of convex portions and a plurality of concave portions and the plurality of convex portions are respectively arranged between the plurality of pattern material portions of the pattern layer.

15. The display apparatus of claim 13, wherein each of the plurality of pattern material portions of the pattern layer has a circular shape, an oval shape, or a polygonal shape on a plane.

16. The display apparatus of claim 1, further comprising:
- a pixel circuit arranged between the light-emitting element and the lower metal layer to overlap the lower metal layer in a plan view.

* * * * *